US012575259B2

(12) United States Patent　　　(10) Patent No.:　US 12,575,259 B2
Yamazaki et al.　　　　　　　　　(45) Date of Patent:　　Mar. 10, 2026

(54) OXYGEN FIXING PASSIVATION LAYER FOR DISPLAY BACKPLANE

(71) Applicant: SEMICONDUCTOR ENERGY LABORATORY CO., LTD., Atsugi (JP)

(72) Inventors: Shunpei Yamazaki, Tokyo (JP); Yasuhiro Jinbo, Kanagawa (JP); Yasumasa Yamane, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 403 days.

(21) Appl. No.: 18/260,818

(22) PCT Filed: Jan. 5, 2022

(86) PCT No.: PCT/IB2022/050050
§ 371 (c)(1),
(2) Date: Jul. 10, 2023

(87) PCT Pub. No.: WO2022/153137
PCT Pub. Date: Jul. 21, 2022

(65) Prior Publication Data
US 2024/0057453 A1　　Feb. 15, 2024

(30) Foreign Application Priority Data

Jan. 14, 2021　(JP) ................................. 2021-004093

(51) Int. Cl.
*H10K 59/12*　　　(2023.01)
*H10K 59/80*　　　(2023.01)
(52) U.S. Cl.
CPC ....... *H10K 59/1201* (2023.02); *H10K 59/874* (2023.02); *H10K 59/873* (2023.02)

(58) Field of Classification Search
CPC ............. H10K 59/1201; H10K 59/874; H10K 59/873; H10K 59/123; H10D 86/423; H10D 86/481; H10D 86/60
See application file for complete search history.

(56) References Cited

U.S. PATENT DOCUMENTS 5,953,985 A　9/1999　Kobayashi
6,120,338 A　9/2000　Hirano et al.
(Continued)

FOREIGN PATENT DOCUMENTS

CN　001372434 A　10/2002
CN　104882548 A　9/2015
(Continued)

OTHER PUBLICATIONS

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.
(Continued)

*Primary Examiner* — J. E. Schoenholtz
(74) *Attorney, Agent, or Firm* — Fish & Richardson P.C.

(57)　　　　ABSTRACT

A highly reliable display device is provided. The display device including a light-emitting element and an insulating layer placed to cover the light-emitting element and the light-emitting element includes a first conductive layer, an EL layer over the first conductive layer, and a second conductive layer over the EL layer and the insulating layer includes a first layer, a second layer over the first layer, and a third layer over the second layer and the first layer has a function of capturing or fixing at least one of water and oxygen, the second layer has a function of inhibiting diffusion of at least one of water and oxygen, and the third layer
(Continued)

has a higher concentration of carbon than at least one of the first layer and the second layer.

20 Claims, 17 Drawing Sheets

(56) References Cited

U.S. PATENT DOCUMENTS

| | | | |
|---|---|---|---|
| 6,743,475 B2 | 6/2004 | Skarp et al. | |
| 6,884,465 B2 | 4/2005 | Skarp et al. | |
| 6,933,002 B2 | 8/2005 | Tera et al. | |
| 7,112,115 B1 | 9/2006 | Yamazaki et al. | |
| 7,399,991 B2 | 7/2008 | Seo et al. | |
| 7,476,420 B2 | 1/2009 | Skarp et al. | |
| 7,663,149 B2 | 2/2010 | Seo et al. | |
| 7,977,876 B2 | 7/2011 | Yamazaki et al. | |
| 8,358,057 B2 | 1/2013 | Oota | |
| 9,766,763 B2 | 9/2017 | Jinbo et al. | |
| 10,032,831 B2 | 7/2018 | Matsumoto et al. | |
| 10,236,357 B2 | 3/2019 | Yamane et al. | |
| 11,011,731 B2 | 5/2021 | Kim et al. | |
| 11,205,664 B2 | 12/2021 | Yamazaki et al. | |
| 11,587,981 B2 | 2/2023 | Ikeda et al. | |
| 2001/0031379 A1* | 10/2001 | Tera | H10K 50/8445 |
| | | | 313/506 |
| 2002/0072139 A1 | 6/2002 | Kashiwabara | |
| 2002/0113546 A1 | 8/2002 | Seo et al. | |
| 2005/0112874 A1 | 5/2005 | Skarp et al. | |
| 2007/0018566 A1 | 1/2007 | Yamazaki et al. | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0264320 A1* | 9/2014 | Liang | H10D 99/00 |
| | | | 257/43 |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0213872 A1 | 7/2017 | Jinbo et al. | |
| 2017/0256754 A1 | 9/2017 | Defranco et al. | |
| 2017/0278907 A1 | 9/2017 | Matsumoto et al. | |
| 2018/0190908 A1 | 7/2018 | Ke et al. | |
| 2019/0355934 A1 | 11/2019 | Kim et al. | |
| 2020/0203662 A1 | 6/2020 | Mollard et al. | |
| 2024/0224639 A1* | 7/2024 | Yang | H10K 59/1201 |
| 2025/0133908 A1* | 4/2025 | Wang | H10K 50/19 |

FOREIGN PATENT DOCUMENTS

| | | |
|---|---|---|
| CN | 110192290 A | 8/2019 |
| JP | 2000-036385 A | 2/2000 |
| JP | 2001-203076 A | 7/2001 |
| JP | 2001-284042 A | 10/2001 |
| JP | 2002-324673 A | 11/2002 |
| JP | 2003-059663 A | 2/2003 |
| JP | 2006-165537 A | 6/2006 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-115905 A | 6/2016 |
| JP | 2016-197494 A | 11/2016 |
| JP | 2019-179696 A | 10/2019 |
| JP | 2020-514979 | 5/2020 |
| JP | 2020-160305 A | 10/2020 |
| KR | 2001-0051478 A | 6/2001 |
| KR | 2002-0068963 A | 8/2002 |
| KR | 2003-0017240 A | 3/2003 |
| KR | 2018-0080901 A | 7/2018 |
| TW | 202002273 | 1/2020 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/050050) Dated Apr. 26, 2022.

Written Opinion (Application No. PCT/IB2022/050050) Dated Apr. 26, 2022.

Taiwanese Office Action (Application No. 111100215) Dated Sep. 15, 2025.

* cited by examiner

OXYGEN FIXING PASSIVATION LAYER FOR DISPLAY BACKPLANE

CROSS REFERENCE TO RELATED APPLICATIONS

This application is a U.S. National Phase Application under 35 U.S.C. § 371 of International Application PCT/IB2022/050050, filed on Jan. 5, 2022, which is incorporated by reference and claims the benefit of a foreign priority application filed in Japan on Jan. 14, 2021, as Application No. 2021-004093.

TECHNICAL FIELD

One embodiment of the present invention relates to a display device and a display module. One embodiment of the present invention relates to a fabrication method of the display device.

Note that one embodiment of the present invention is not limited to the above technical field. Examples of the technical field of one embodiment of the present invention disclosed in this specification and the like include a semiconductor device, a display device, a light-emitting apparatus, a power storage device, a storage device, an electronic device, a lighting device, an input device, an input/output device, a driving method thereof, and a fabrication method thereof. Note that in this specification and the like, a semiconductor device refers to every device that can function by utilizing semiconductor characteristics.

BACKGROUND ART

In recent years, higher-resolution display panels have been required. For example, devices for virtual reality (VR), augmented reality (AR), substitutional reality (SR), or mixed reality (MR) are given as devices requiring high-resolution display panels and have been actively developed in recent years.

Examples of display devices that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

For example, in the above-described devices for VR, AR, SR, or MR that are wearable, a lens for focus adjustment needs to be provided between eyes and the display panels. Since part of the screen is enlarged by the lens, low resolution of the display panels might cause a problem of weak sense of reality and immersion.

The display panel is also required to have high color reproducibility. In particular, when display panels which have high color reproducibility are used in the above-described devices for VR, AR, SR, or MR, display with colors which are close to those of actual objects can be performed and sense of reality and immersion can be enhanced.

An object of one embodiment of the present invention is to provide a display device with extremely high resolution. Another object of one embodiment of the present invention is to provide a highly reliable display device. Another object of one embodiment of the present invention is to provide a display device in which high color reproducibility is achieved. Another object of one embodiment of the present invention is to provide a high-luminance display device. Another object of one embodiment of the present invention is to provide a fabrication method of the above-described display device.

Note that the description of these objects does not preclude the existence of other objects. One embodiment of the present invention does not need to achieve all these objects. Note that objects other than these can be derived from the description of the specification, the drawings, the claims, and the like.

Means for Solving the Problems

One embodiment of the present invention is a display device including a light-emitting element and an insulating layer placed to cover the light-emitting element; the light-emitting element includes a first conductive layer, an EL layer over the first conductive layer, and a second conductive layer over the EL layer; the insulating layer includes a first layer, a second layer over the first layer, and a third layer over the second layer; the first layer has a function of capturing or fixing at least one of water and oxygen; the second layer has a function of inhibiting diffusion of at least one of water and oxygen; and the third layer has a higher concentration of carbon than at least one of the first layer and the second layer.

Another embodiment of the present invention is a display device including a transistor over a substrate, a first insulating layer over the transistor, a plug placed to be embedded in the first insulating layer, a light-emitting element over the first insulating layer, and a second insulating layer placed to cover the light-emitting element; the light-emitting element includes a first conductive layer, an EL layer over the first conductive layer, and a second conductive layer over the EL layer; the plug electrically connects one of a source and a drain of the transistor and the first conductive layer; the second insulating layer includes a first layer, a second layer over the first layer, and a third layer over the second layer; the first layer has a function of capturing or fixing at least one of water and oxygen, the second layer has a function of inhibiting diffusion of at least one of water and oxygen, and the third layer has a higher concentration of carbon than at least one of the first layer and the second layer.

In the above structure, the third insulating layer may be included between the first insulating layer and the light-emitting element, and the third insulating layer may have a function of inhibiting diffusion of at least one of water and oxygen. In the above structure, the third insulating layer preferably contains nitrogen and silicon. In the above structure, the third insulating layer may be in contact with the second insulating layer in a region not overlapping with the light-emitting element.

In the above structure, the substrate may be a silicon substrate and the transistor may contain silicon in a channel formation region. In the above structure, an oxide semiconductor film may be provided over the substrate and the transistor may include an oxide semiconductor film in a channel formation region.

In the above structure, the first layer is preferably in contact with a side surface of the EL layer. In the above structure, the first layer is preferably deposited by a sputtering method. In the above structure, the first layer preferably contains oxygen and aluminum. In the above structure, the first layer may contain oxygen and hafnium.

In the above structure, the second layer is preferably deposited by a sputtering method. In the above structure, the second layer preferably contains nitrogen and silicon.

In the above structure, the third layer is preferably deposited by an ALD method. In the above structure, the third layer may have a higher concentration of hydrogen than at least one of the first layer and the second layer. In the above structure, the third layer may have a lower density than at least one of the first layer and the second layer. In the above structure, the third layer may contain oxygen and aluminum.

In the above structure, the side surface of the EL layer may be positioned inward from a side surface of the first conductive layer. In the above structure, the EL layer may cover the side surface of the first conductive layer. In the above structure, an insulator may be provided between the EL layer and the first conductive layer, the insulator may include an opening over the first conductive layer, and the EL layer may be in contact with the first conductive layer in the opening.

Effect of the Invention

According to one embodiment of the present invention, a display device with extremely high resolution can be provided. A highly reliable display device can be provided. A display device in which high color reproducibility is achieved can be provided. A high-luminance display device can be provided. A fabrication method of the above-described display device can be provided.

Note that the description of these effects does not preclude the existence of other effects. One embodiment of the present invention does not need to have all these effects. Note that other effects can be derived from the description of the specification, the drawings, and the claims.

BRIEF DESCRIPTION OF THE DRAWINGS

FIG. 17A to FIG. 17D are diagrams illustrating structure examples of a display device.

MODE FOR CARRYING OUT THE INVENTION

Figure 1A:
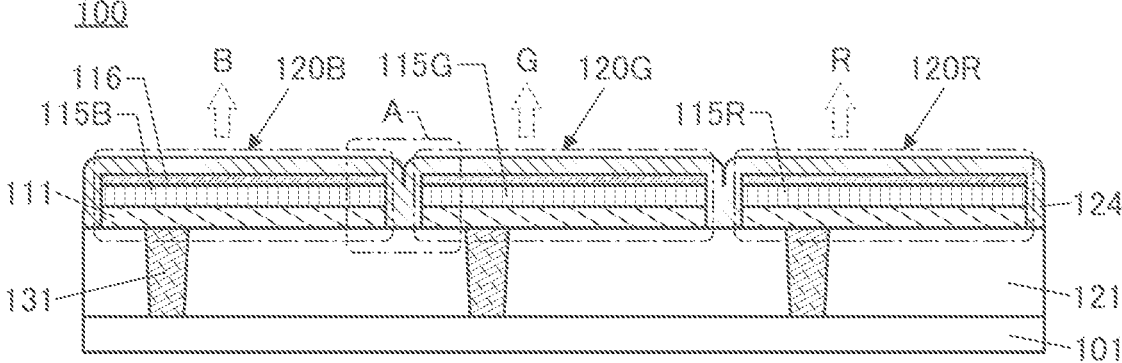
FIG. 1A to FIG. 1C are diagrams illustrating structure examples of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

In this specification and the like, the ordinal numbers such as "first" and "second" are used in order to avoid confusion among components and do not limit the number.

Embodiment 1

In this embodiment, a display device of one embodiment of the present invention and a fabrication method of the display device will be described.

The display device of one embodiment of the present invention includes a light-emitting element (also referred to as a light-emitting device) which emits light of different colors. The light-emitting element includes a lower electrode, an upper electrode, and a light-emitting layer (also referred to as a layer containing a light-emitting compound) therebetween. As the light-emitting element, an electroluminescent element such as an organic EL element or an inorganic EL element is preferably used. Alternatively, a light-emitting diode (LED) may be used.

As the EL element, an OLED (Organic Light Emitting Diode), a QLED (Quantum-dot Light Emitting Diode), or the like can be used. Examples of the light-emitting compound (also referred to as a light-emitting substance) contained in the EL element include a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescence (TADF) material).

As the light-emitting substance, a substance that exhibits an emission color of blue, purple, bluish purple, green, yellowish green, yellow, orange, red, or the like is appropriately used. A substance that emits near-infrared light may be used.

The light-emitting layer may contain one or more kinds of compounds (a host material and an assist material) in addition to the light-emitting substance (a guest material). As the host material and the assist material, one or more kinds of substances having a larger energy gap than the light-emitting substance (the guest material) can be selected and used. As the host material and the assist material, compounds which form an exciplex are preferably used in combination. In order to form an exciplex efficiently, it is particularly preferable to combine a compound which easily accepts holes (a hole-transport material) and a compound which easily accepts electrons (an electron-transport material).

Either a low molecular compound or a high molecular compound can be used for the light-emitting element and an inorganic compound (such as a quantum dot material) may also be contained in the light-emitting element.

In the display device of one embodiment of the present invention, the light-emitting elements of different colors can be separately formed with extremely high accuracy. Thus, a display device with higher resolution than a conventional display device can be achieved. For example, the display device preferably has extremely high resolution in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

More specific structure examples and a fabrication method example will be described below with reference to drawings.

Structure Example 1

Figure 1B:
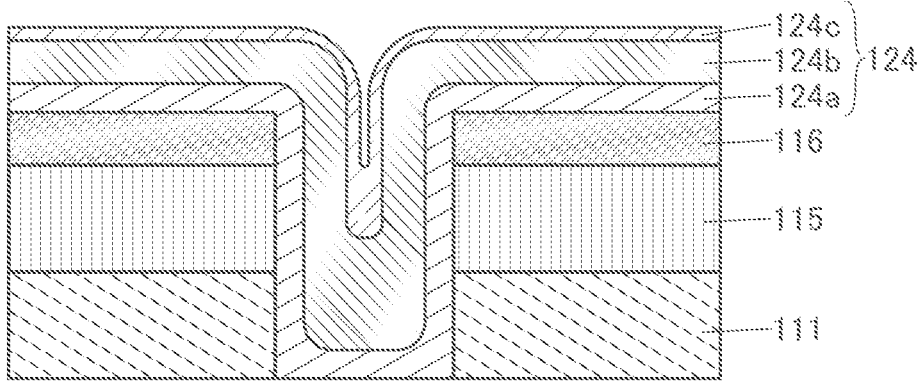

FIG. 1A is a schematic cross-sectional view illustrating a display device of one embodiment of the present invention. FIG. 1B is an enlarged view of a region A illustrated in FIG. 1A which is sandwiched between the light-emitting elements 120. A display device 100 includes a light-emitting element 120R, a light-emitting element 120G, and a light-emitting element 120B. The light-emitting element 120R is a light-emitting element which emits red light, the light-emitting element 120G is a light-emitting element which emits green light, and the light-emitting element 120B is a light-emitting element which emits blue light.

In the following description common to the light-emitting element 120R, the light-emitting element 120G, and the light-emitting element 120B, the alphabets added to the reference numerals are omitted and the term "light-emitting element 120" is used in the description in some cases. An EL layer 115R, an EL layer 115G, and an EL layer 115B which are described later are also described by the term "EL layer 115" in some cases. The EL layer 115R is included in the light-emitting element 120R. Similarly, the EL layer 115G is included in the light-emitting element 120G and the EL layer 115B is included in the light-emitting element 120B. A conductive layer 114R, a conductive layer 114G, and a conductive layer 114B which are described later are also described by the term "conductive layer 114" in some cases. The conductive layer 114R is included in the light-emitting element 120R. Similarly, the conductive layer 114G is included in the light-emitting element 120G and the conductive layer 114B is included in the light-emitting element 120B.

The light-emitting element 120 includes a conductive layer 111 which functions as a lower electrode, the EL layer 115, and a conductive layer 116 which functions as an upper electrode. The conductive layer 111 has a reflective property with respect to visible light. The conductive layer 116 has a transmissive property and a reflective property with respect to visible light. Alternatively, the conductive layer 116 has a semi-transmissive and semi-reflective property with respect to visible light in some cases. The EL layer 115 contains a light-emitting compound. The EL layer 115 includes at least a light-emitting layer included in the light-emitting element 120.

As the light-emitting element 120, the electroluminescent element having a function of emitting light in accordance with current flowing into the EL layer 115 when a potential difference is applied between the conductive layer 111 and the conductive layer 116 can be used. In particular, an organic EL element using a light-emitting organic compound is preferably used for the EL layer 115. In addition, the light-emitting element 120 is preferably an element emitting white light, which has two or more peaks in the visible light region of the emission spectrum.

The top surface of the conductive layer 111 has a reflective property with respect to visible light.

The display device 100 includes a substrate 101 including a semiconductor circuit and the light-emitting element 120 over the substrate 101. The display device 100 illustrated in FIG. 1A includes an insulating layer 121 over the substrate 101, the light-emitting element 120 over the insulating layer 121, and an insulating layer 124 placed to cover the light-emitting element 120. The insulating layer 124 is preferably in contact with the top surface and a side surface of the conductive layer 116, a side surface of the EL layer 115, and a side surface of the conductive layer 111. The insulating layer 124 is in contact with the insulating layer 121 in a region not overlapping with the light-emitting element 120 in some cases.

A circuit board including a transistor, a wiring, and the like can be used as the substrate 101. Note that in the case in which a passive matrix method or a segment method can be employed, an insulating substrate such as a glass substrate can be used as the substrate 101. The substrate 101 is a substrate provided with a circuit for driving each light-emitting element (also referred to as a pixel circuit). The substrate 101 may be provided with a semiconductor circuit functioning as a driver circuit for driving the pixel circuit. A semiconductor element included in the pixel circuit or the semiconductor circuit may be formed using a semiconductor substrate such as a silicon substrate or using an oxide semiconductor film. More specific structure examples of the substrate 101 will be described later.

In the display device 100 in FIG. 1A, the substrate 101 and the conductive layer 111 of the light-emitting element 120 are electrically connected to each other through a plug 131. The plug 131 is formed to be embedded in an opening provided in the insulating layer 121. The conductive layer 111 is formed over the insulating layer 121. The conductive layer 111 is provided over the plug 131. The conductive layer 111 and the plug 131 are electrically connected to each other. The conductive layer 111 is preferably in contact with the top surface of the plug 131. The conductive layer 111 may be in contact with the top surface of the insulating layer 121.

The insulating layer 124 preferably functions as a barrier insulating film against at least one of water and oxygen. The insulating layer 124 further preferably functions as a barrier insulating film against hydrogen, substance to which hydrogen is bonded (e.g., water ($H_2O$)), oxygen, chlorine, and the like. Moreover, the insulating layer 124 preferably includes a layer having a function of inhibiting diffusion of at least one of water and oxygen. The insulating layer 124 further preferably includes a layer having a function of inhibiting diffusion of hydrogen, substance to which hydrogen is bonded (e.g., water ($H_2O$)), oxygen, chlorine, and the like. Moreover, the insulating layer 124 preferably includes a layer having a function of capturing or fixing (also referred to as gettering) at least one of water and oxygen. The insulating layer 124 further preferably includes a layer having a function of capturing or fixing hydrogen, substance to which hydrogen is bonded (e.g., water ($H_2O$)), oxygen, chlorine, and the like.

Note that in this specification, a barrier insulating film refers to an insulating film having a barrier property. In this specification, a barrier property means a function of inhibiting diffusion of a targeted substance (also referred to as having low permeability). Alternatively, a barrier property means a function of capturing or fixing a targeted substance.

Here, as illustrated in FIG. 1B, the insulating layer 124 preferably includes a layer 124a, a layer 124b over the layer 124a, and a layer 124c over the layer 124b. Note that the layer 124a has a function of capturing or fixing at least one of water and oxygen. The layer 124b has a function of inhibiting diffusion of at least one of water and oxygen. The layer 124c is a layer with favorable coverage.

The layer 124a is placed at least between the layer 124b and the EL layer 115. The layer 124a is preferably in contact with the top surface and the side surface of the conductive layer 116, the side surface of the EL layer 115, and the a side surface of the conductive layer 111. The layer 124a is in contact with the insulating layer 121 in a region sandwiched between the conductive layers 111 in some cases. The layer 124b is preferably provided to cover the layer 124a and in contact with the top surface of the layer 124a.

When the layer 124a and the layer 124b are provided in the above manner, the layer 124a can capture or fix impurities such as oxygen or water in the light-emitting element 120 in a region covered with the layer 124b, whereby the amount of impurities included in the light-emitting element 120 can be reduced. In particular, since the layer 124a is provided in contact with the side surface of the EL layer 115 to which impurities are easily attached in processing, an unintended layer including the impurities can be inhibited from being formed on the side surface of the EL layer 115. Furthermore, the layer 124b can prevent impurities such as oxygen or water from diffusing from above the insulating layer 124 to the light-emitting element 120 and prevent an increase in the amount of impurities in the light-emitting element.

The layer 124c is preferably provided to cover the layer 124b and in contact with the top surface of the layer 124b. The layer 124c is preferably deposited by an atomic layer deposition (ALD) method that achieves favorable coverage.

Here, the layer 124b has unevenness that reflects the shape of the formation surface, that is, step shapes of the conductive layer 111, the EL layer 115, and the conductive layer 116. Thus, disconnection might be formed in the layer 124b. However, since the layer 124c with favorable coverage is provided as described above, even when disconnection is formed in the layer 124b, the disconnection can be filled by the layer 124c. Thus, the layer 124b can maintain the function of inhibiting diffusion of impurities such as water or oxygen.

In the above manner, one embodiment of the present invention can reduce impurities such as water and oxygen in the light-emitting element and prevent deterioration of the light-emitting element, and thus a highly reliable display device can be provided.

Figure 1C:
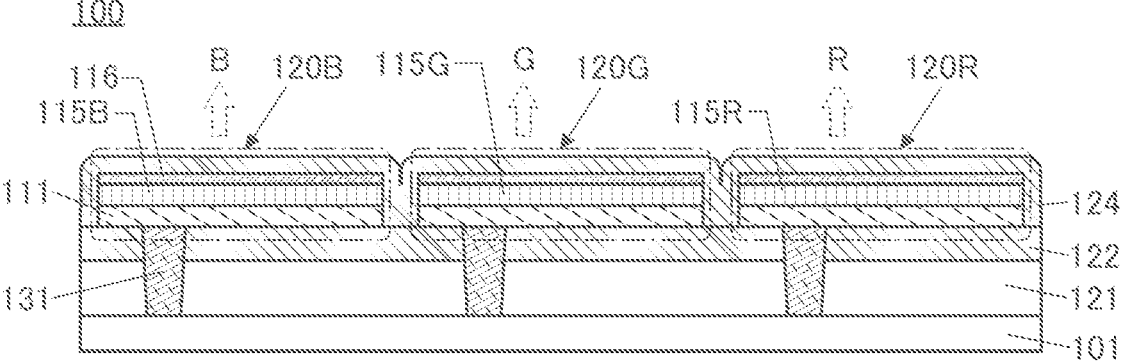

Alternatively, as illustrated in FIG. 1C, an insulating layer 122 may be provided between the insulating layer 121 and each of the conductive layer 111 and the insulating layer 124. The insulating layer 122 as well as the insulating layer 124 preferably functions as a barrier insulating film against at least one of water and oxygen. As the insulating layer 122, it is preferable to use either one or both of an insulating layer having a function similar to that of the layer 124a and an insulating layer having a function similar to that of the layer 124b. For example, as the insulating layer 122, a stacked layer including an insulating layer having a function similar to that of the layer 124b and an insulating layer thereover having a function similar to that of the layer 124a can be used.

The insulating layer 122 functioning as a barrier insulating film against water, oxygen, or the like is provided below the light-emitting element 120, whereby impurities such as water or oxygen included in the interlayer insulating film and the semiconductor circuit such as the pixel circuit which are provided below the light-emitting element 120 can be inhibited from diffusing into the light-emitting element 120. Thus, deterioration of the light-emitting element 120 can be prevented.

When an oxide semiconductor is provided in the above semiconductor circuit, impurities such as water or hydrogen included in the light-emitting element and the interlayer insulating film over the light-emitting element can be inhibited from diffusing into the oxide semiconductor. Thus, a decrease in electrical characteristics and reliability of an element including the oxide semiconductor can be prevented.

In the structure illustrated in FIG. 1C, the insulating layer 124 is preferably in contact with the insulating layer 122 in a region not overlapping with the conductive layer 111. Here, the insulating layer 124 is in contact with the top surface and the side surface of the conductive layer 116, the side surface of the EL layer 115, and the side surface of the conductive layer 111. Thus, the light-emitting element 120 is surrounded by the insulating layer 124 and the insulating layer 122. When the layer 124a is provided in a region surrounded by the insulating layer 124 and the insulating layer 122, impurities such as water or oxygen in the light-emitting element can be more efficiently captured by or fixed in the layer 124a.

In the display device 100 illustrated in FIG. 1A to FIG. 1C, each of the EL layer 115 and the conductive layer 116 is separated between adjacent light-emitting elements of different colors. Hence, leakage current flowing through the EL layer 115 between adjacent light-emitting elements of different colors can be prevented. Thus, light emission due to the leakage current can be suppressed and display with a high contrast can be achieved. Furthermore, since the EL layer 115 can be formed using a highly conductive material even when the resolution is increased, the range of choices for materials can be widened; thus, an improvement in efficiency, a reduction in power consumption, and an increase in reliability can be easily achieved.

Note that in the display device 100, the EL layer 115 and the conductive layer 116 are preferably processed so that they each are continuous without separation between pixels having the same color. For example, the EL layer 115 and the conductive layer 116 can be processed into a stripe shape. Thus, the conductive layers 116 of all the light-emitting elements can be supplied with a predetermined potential without being in a floating state.

The EL layer 115 and the conductive layer 116 may be patterned into an island shape by deposition using a shadow mask such as a metal mask or an FMM (a fine metal mask), it is particularly preferable to use a processing method without using a metal mask or an FMM. As such a processing method, typically, a photolithography method can be used. Alternatively, formation method such as a nanoimprinting method or a sandblasting method can be used. Note that in this specification and the like, a device formed using a metal mask or an FMM is sometimes referred to as a device having an MM (metal mask) structure. In this specification and the like, a device formed without using a metal mask or an FMM is sometimes referred to as a device having an MML (metal maskless) structure.

Thus, a device having an MML structure can have an extremely minute pattern, and therefore can have improved resolution and aperture ratio compared to a device having an MM structure.

Figure 2A:
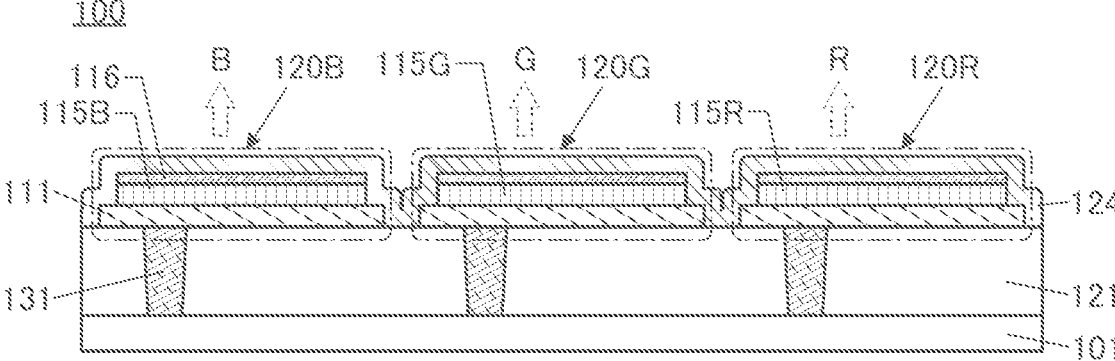
FIG. 2A to FIG. 2C are diagrams illustrating structure examples of a display device.

As illustrated in FIG. 1A or FIG. 1C, end portions of the EL layer 115 may be substantially aligned with end portions of the conductive layer 111. End portions of the conductive layer 116 may be substantially aligned with the end portions of the conductive layer 111. One end portion of the EL layer 115 may be positioned outward from the conductive layer 111 and the other may be substantially aligned with the end portion of the conductive layer 111. One end portion of the conductive layer 116 may be positioned outward from the conductive layer 111 and the other may be substantially aligned with the end portion of the conductive layer 111. As illustrated in FIG. 2A, the end portions of the EL layer 115 may be positioned to be inward from the end portions of the conductive layer 111 in a cross section of the display device 100.

Figure 2B:
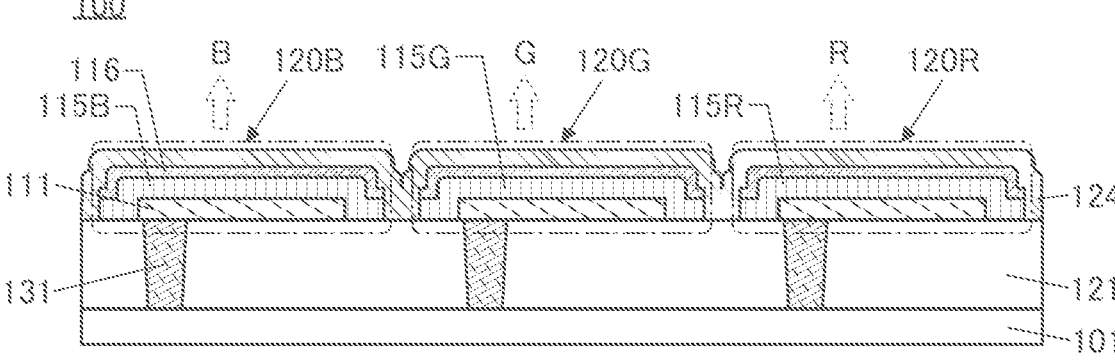

The conductive layer 116 may be placed at least not to be short-circuited with the conductive layer 111. For example, as illustrated in FIG. 2B, the end portions of the EL layer 115 may be positioned to be outward from the end portions of the conductive layer 111 in the cross section of the display device 100. The end portions of the conductive layer 111 are covered with the end portions of the EL layer 115. The end portions of the EL layer 115 are located outward from the end portions of the conductive layer 111, whereby a short circuit between the conductive layer 111 and the conductive layer 116 can be inhibited. As illustrated in FIG. 2B, the end portions of the conductive layer 116 may be positioned to be outward from the end portions of the conductive layer 111 in the cross section of the display device 100.

Figure 2C:
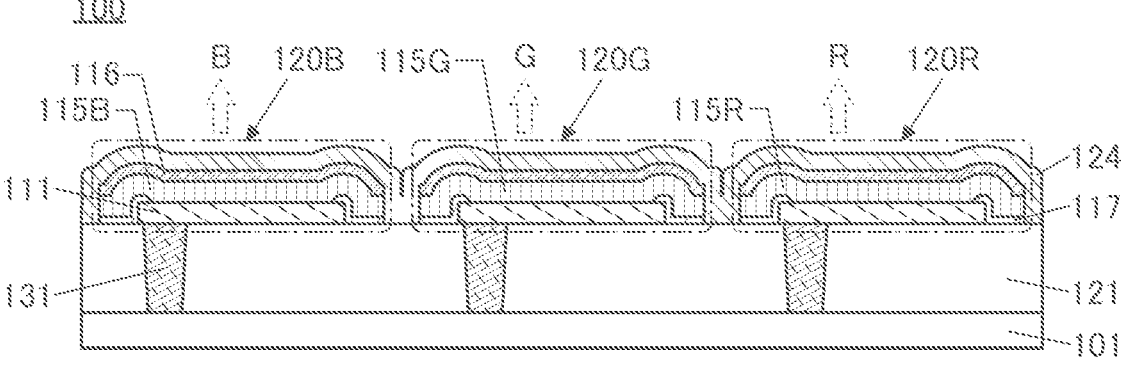

As illustrated in FIG. 2C, an insulator 117 covering the end portions of the conductive layer 116 may be provided. The insulator 117 can also be referred to as a bank, a partition, a barrier, an embankment, or the like. The insulator 117 is provided to expose the top surface of the conductive layer 111. When the insulator 117 is provided, a short circuit between the conductive layer 111 and the conductive layer 116 can be inhibited.

Note that although FIG. 2A to FIG. 2C illustrate the structure in which the insulating layer 124 is provided as in FIG. 1A, the structure is not limited to this and a structure similar to that illustrated in FIG. 1C may be employed.

[Light-Emitting Element]

As a light-emitting element that can be used as the light-emitting element 120, a self-luminous element can be used, and an element whose luminance is controlled by current or voltage is included in its category. For example, an LED, an organic EL element, or an inorganic EL element can be used. In particular, an organic EL element is preferably used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which light is not extracted.

In one embodiment of the present invention, in particular, a light-emitting element with a top-emission structure in which light is emitted toward the side opposite to the formation surface side or a dual-emission structure in which light is emitted toward both the formation surface side and the side opposite to the formation surface side can be favorably used.

The EL layer 115 includes at least a light-emitting layer. In addition to the light-emitting layer, the EL layer 115 may further include layers containing a substance with a high hole-injection property, a substance with a high hole-transport property, a hole-blocking material, a substance with a high electron-transport property, a substance with a high electron-injection property, a substance with a bipolar property (a substance with a high electron-transport property and hole-transport property), and the like.

Either a low molecular compound or a high molecular compound can be used for the EL layer 115 and an inorganic compound may also be contained. Layers included in the EL layer 115 can each be formed by a method such as an evaporation method (including a vacuum evaporation method), a transfer method, a printing method, an inkjet method, or a coating method.

When a voltage higher than the threshold voltage of the light-emitting element 120 is applied between a cathode and an anode, holes are injected to the EL layer 115 from the anode side and electrons are injected to the EL layer 115 from the cathode side. The injected electrons and holes are recombined in the EL layer 115 and a light-emitting substance contained in the EL layer 115 emits light.

Here, an EL layer 115 used for the light-emitting element 120B is referred to as an EL layer 115B, an EL layer 115 used for the light-emitting element 120G is referred to as an EL layer 115G, an EL layer 115 used for the light-emitting element 120R is referred to as an EL layer 115R. The EL layer 115B contains a light-emitting substance emitting B (blue) light. The EL layer 115G contains a light-emitting substance emitting G (green) light. The EL layer 115R contains a light-emitting substance emitting R (red) light. Such a structure in which emission colors (here, blue (B), green (G), and red (R)) are separately patterned for each of the light-emitting elements is referred to as a SBS (Side By Side) structure in some cases. With such a structure, a display device with lower power consumption than a display device with a structure in which a white light-emitting element is colored by a coloring layer can be provided.

Note that the above-described light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

As the quantum dot material, a colloidal quantum dot material, an alloyed quantum dot material, a core-shell quantum dot material, a core quantum dot material, or the like can be used. The material containing elements belonging to Group 12 and Group 16, elements belonging to Group 13 and Group 15, or elements belonging to Group 14 and Group 16, may be used. Alternatively, the quantum dot material containing an element such as cadmium, selenium, zinc, sulfur, phosphorus, indium, tellurium, lead, gallium, arsenic, or aluminum may be used.

The conductive film that can be used for the conductive layer 116 or the like and transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like formed thin enough to have a light-transmitting property can be used. Furthermore, a stacked-layer film of the above materials can be used for a conductive layer. For example, a stacked-layer film of indium tin oxide and an alloy of silver and magnesium is preferably used, in which case conductivity can be increased. Alternatively, graphene or the like may be used.

The conductive film having a semi-transmissive and semi-reflective property which can be used for the conductive layer 116 preferably has a reflectance with respect to visible light (e.g., the reflectance with respect to light having a predetermined wavelength within the range of 400 nm to 700 nm) of higher than or equal to 20% and lower than or equal to 80%, preferably higher than or equal to 40% and lower than or equal to 70%. The conductive film having reflectivity preferably has a reflectance with respect to visible light of higher than or equal to 40% and lower than or equal to 100%, further preferably higher than or equal to 70% and lower than or equal to 100%. The conductive film having a light-transmitting property preferably has a reflectance with respect to visible light of higher than or equal to 0% and lower than or equal to 40%, further preferably higher than or equal to 0% and lower than or equal to 30%.

The conductive film that reflects visible light is preferably used in a portion of the conductive layer 111 that is located on the EL layer 115 side. For the conductive layer 111, for example, a metal material such as aluminum, gold, platinum, silver, nickel, tungsten, chromium, molybdenum, iron, cobalt, copper, or palladium or an alloy containing any of these metal materials can be used. Copper is preferably used because of its high reflectivity of visible light. In addition, aluminum is preferably used because an aluminum electrode is easily etched, so that processing of the electrode is easy, and aluminum has high reflectivity of visible light and near-infrared light. Lanthanum, neodymium, germanium, or the like may be added to the above metal material or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance. The conductive layer 111 may have a structure in which a conductive metal oxide film is stacked over the conductive film that reflects visible light. With such a structure, oxidization and corrosion of the conductive film reflecting visible light can be inhibited. For example, when a metal film or a metal oxide film is stacked in contact with an aluminum film or an aluminum alloy film, oxidization can be inhibited. Examples of materials for the metal film or the metal oxide film include titanium and titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used.

Figure 3A:
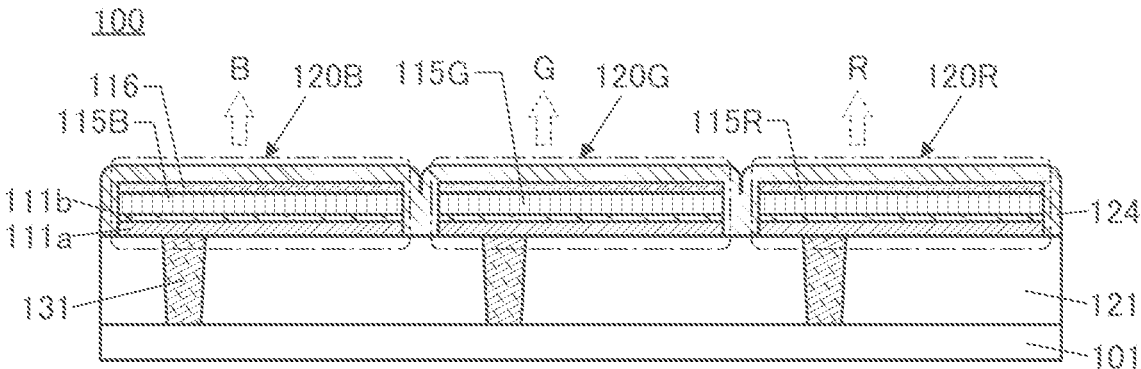
FIG. 3A and FIG. 3B are diagrams illustrating structure examples of a display device.

In the conductive layer 111, as illustrated in FIG. 3A, a conductive layer 111a may be provided as a lower layer, and a conductive layer 111b may be provided over the conductive layer 111a as an upper conductive layer. When such a structure is employed, a conductive film that reflects visible light is preferably used as the conductive layer 111b. The reflectance of the conductive layer 111a may be lower than that of the conductive layer 111b. A material with high conductivity may be used for the conductive layer 111a. A material having a high processing property may be used for the conductive layer 111a.

For the conductive layer 111b, the above-described material and structure which can be used for the conductive layer 111 are preferably employed.

For the conductive layer 111a, for example, a metal material such as gold, silver, platinum, magnesium, nickel, tungsten, chromium, molybdenum, iron, cobalt, copper, palladium, titanium, yttrium, zirconium, or tantalum; an alloy containing any of these metal materials; or a nitride of any of these metal materials (e.g., titanium nitride) can be used.

When aluminum is used as the conductive layer 111 or the conductive layer 111b, the thickness of aluminum is preferably greater than or equal to 40 nm, further preferably greater than or equal to 70 nm, whereby the reflectivity of visible light or the like can be sufficiently increased. When silver is used as the conductive layer 111 or the conductive layer 111b, the thickness of silver is preferably greater than or equal to 70 nm, further preferably greater than or equal to 100 nm, whereby the reflectivity of visible light or the like can be sufficiently increased.

As an example, tungsten can be used for the conductive layer 111a and aluminum or an aluminum alloy can be used for the conductive layer 111b. The conductive layer 111b may have a structure in which titanium oxide is provided in contact with an upper portion of aluminum or an aluminum alloy. Alternatively, the conductive layer 111b may have a structure in which titanium is provided in contact with the upper portion of aluminum or the aluminum alloy, and titanium oxide is provided in contact with the upper portion of the titanium.

Alternatively, both the conductive layer 111a and the conductive layer 111b can be formed using the materials and structures selected from those that can be used for the conductive layer 111.

The conductive layer 111 may be a stacked film including three or more layers.

Note that although FIG. 3A illustrates the structure in which the insulating layer 124 is provided as in FIG. 1A, one embodiment of the present invention is not limited thereto. In the structure illustrated in FIG. 3A, the insulating layer 122 may be further provided as in the structure illustrated in FIG. 1C.

Examples of a material that can be used for the plug 131 include metals such as aluminum, titanium, chromium, nickel, copper, yttrium, zirconium, molybdenum, gold, silver, platinum, magnesium, iron, cobalt, palladium, tantalum, or tungsten; an alloy containing any of these metal materials; and nitride of any of these metal materials. For the plug 131, a film containing any of these materials can be used in a single layer or as a stacked-layer structure. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, and a three-layer structure in which an aluminum film or a copper film is stacked over a molybdenum film or a molybdenum nitride film and a molybdenum film or a molybdenum nitride film is formed thereover can be given. Note that an oxide such as indium oxide, tin oxide, or zinc oxide may be used. Copper containing manganese is preferably used because it increases controllability of a shape by etching.

The electrodes included in the light-emitting element may each be formed by an evaporation method or a sputtering method. Alternatively, a discharging method such as an inkjet method, a printing method such as a screen printing method, or a plating method may be used for the formation.

For the insulating layer 124, an oxide, a nitride, an oxynitride, or a nitride oxide which contains at least one of aluminum, hafnium, magnesium, gallium, indium, zinc, and silicon can be used. Alternatively, the stacked film of any of these materials can be used. For example, aluminum oxide, hafnium oxide, hafnium aluminate, magnesium oxide, gallium oxide, indium gallium zinc oxide, silicon oxide, silicon nitride, silicon oxynitride, or silicon nitride oxide can be used.

For the layer 124a having a function of capturing or fixing impurities such as water or oxygen, for example, a metal oxide deposited by a sputtering method, such as aluminum oxide (AlOx: x is a given number greater than 0) or hafnium oxide (HfOy: y is a given number greater than 0), is preferably used. When aluminum oxide is used for the layer 124a, the layer 124a is an insulator containing at least oxygen and aluminum. When hafnium oxide is used for the layer 124a, the layer 124a is an insulator containing at least oxygen and hafnium.

The layer 124a preferably contains a large amount of oxygen vacancies. A large number of dangling bonds are formed in a metal oxide containing such a large amount of oxygen vacancies in some cases, and the metal oxide has a property of capturing or fixing impurities such as water or oxygen in the dangling bonds in some cases. When such a metal oxide containing a large amount of oxygen vacancies is used, impurities such as water or oxygen can be captured or fixed in the layer 124a. In particular, impurities such as water or oxygen attached to the side surface of the EL layer 115 are preferably captured or fixed.

The layer 124a is preferably deposited by a sputtering method. When the layer 124a is deposited by a sputtering method, the deposition can be performed without using impurities such as water in a deposition gas, whereby an increase in a concentration of impurities such as water in the layer 124a and the light-emitting element 120 can be inhibited. When the layer 124a is deposited by a sputtering method, it is preferable that the amount of oxygen in the deposition gas be decreased or oxygen be not contained in the deposition gas. Thus, an increase in the amount of oxygen in the layer 124a and the light-emitting element 120 can be inhibited. Moreover, a large amount of oxygen vacancies can be contained in the deposited layer 124a.

A metal oxide having an amorphous structure may be used for the layer 124a. Note that a crystal region may be formed in a part of the layer 124a. The layer 124a may have a multilayer structure in which a layer with an amorphous structure and a layer including a crystal region are stacked. For example, the layer 124a can have a stacked-layer structure in which a layer including a crystal region, typically, a layer with a polycrystalline structure, is provided over a layer with an amorphous structure.

As the layer 124b having a function of inhibiting diffusion of impurities such as water or oxygen, for example, a silicon nitride (SiNx: x is a given number greater than 0) deposited by a sputtering method or the like is preferably used. In that case, the layer 124b is an insulator containing at least nitrogen and silicon. It is preferable that the layer 124b have a film thickness of greater than or equal to 10 nm, for example, about greater than or equal to 20 nm and less than or equal to 100 nm, or for example, about greater than or equal to 20 nm and less than or equal to 50 nm over the conductive layer 116 so as to inhibit diffusion of impurities such as water or oxygen.

The layer 124b is preferably deposited by a sputtering method. When the layer 124b is deposited by a sputtering method, a metal nitride can be deposited without using impurities such as water or oxygen as a deposition gas, whereby an increase in a concentration of impurities such as water or oxygen in the layer 124b, the layer 124a, and the light-emitting element 120 can be inhibited.

For the layer 124c with favorable coverage, the insulating material that can be used for the above-described insulating layer 124 can be used. For example, aluminum oxide or hafnium oxide deposited by an ALD method is preferably used. When a metal oxide is deposited by an ALD method, $H_2O$, $O_3$, or the like is used as an oxidizer; however, the layer 124b and the layer 124a are formed before the layer 124c is deposited; thus, the amount of impurities such as water or oxygen entering the EL layer 115 and the like can be decreased.

Note that a precursor used in an ALD method sometimes contains impurities such as hydrogen or carbon. Thus, a film provided by an ALD method contains impurities such as hydrogen or carbon in a larger amount than a film provided by another deposition method in some cases. Thus, the layer 124c has a higher concentration of carbon than at least one of the layer 124a and the layer 124b which are deposited by a sputtering method in some cases. Furthermore, the layer 124c has a higher concentration of hydrogen than at least one of the layer 124a and the layer 124b which are deposited by a sputtering method in some cases. Note that impurities such as hydrogen or carbon can be quantified by energy dispersive X-ray spectroscopy (EDX), X-ray photoelectron spectroscopy (XPS), secondary ion mass spectrometry (SIMS), or the like.

The density of films deposited by an ALD method tends to be lower than that of films formed by a sputtering method in some cases. Thus, the density of the layer 124c is lower than that of at least one of the layer 124a and the layer 124b deposited by a sputtering method in some cases. Note that the density can be measured using an X-ray reflectometry (XRR) analysis or the like.

Examples of an ALD method include a thermal ALD method, in which a precursor and a reactant react with each other only by thermal energy, and a PEALD (Plasma Enhanced ALD) method, in which a reactant excited by plasma is used. If the deposition can be performed at such a temperature as not to deteriorate the EL layer 115 (e.g. about higher than or equal to room temperature and lower than or equal to 100° C.), any ALD method can be used for the deposition.

Similarly, any of the insulating materials that can be used for the layer 124a or the layer 124b may be used for the insulating layer 122. Furthermore, the insulating layer 122 may also have a stacked-layer structure. For example, when the insulating layer 122 has a two-layer structure, a structure in which an aluminum oxide film deposited by a sputtering method is provided over a silicon nitride film deposited by a sputtering method can be employed.

It is preferable that the insulating layer 121 function as an interlayer insulating film and have a low permittivity. When a material with a low permittivity is used for an interlayer film, the parasitic capacitance generated between wirings can be reduced. For the insulating layer 121, for example, silicon oxide, silicon oxynitride, silicon oxide to which fluorine is added, silicon oxide to which carbon is added, silicon oxide to which carbon and nitrogen are added, or porous silicon oxide is appropriately used. In this case, in the insulating layer 121, a depressed portion is formed on the surface where the conductive layer 111 is not provided, in some cases. For example, in an etching process of forming the conductive layer 111, the insulating layer 121 is etched, whereby the depressed portion is formed.

In addition, the insulator 117 illustrated in FIG. 2C may be formed using any of insulating materials that can be used for the insulating layer 121.

Figure 3B:
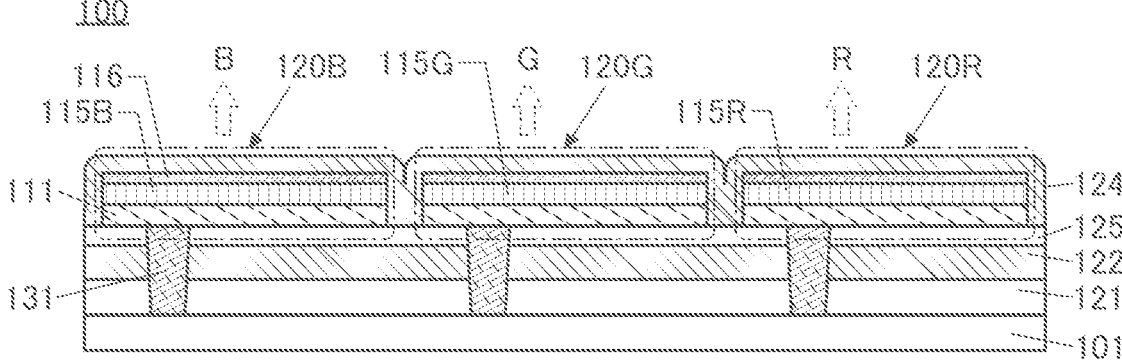

Although in the structure illustrated in FIG. 1C, the insulating layer 122 is in contact with the conductive layer 111 and the insulating layer 124, a structure in which the insulating layer 125 is provided between the insulating layer 122 and each of the conductive layer 111 and the insulating layer 124 may be employed as illustrated in FIG. 3B, for example. As the insulating layer 125, an insulating material that can be used as the insulating layer 121 can be used. In this case, in the insulating layer 125, a depressed portion is formed on the surface where the conductive layer 111 is not provided, in some cases. For example, in an etching process of forming the conductive layer 111, the insulating layer 125 is etched, whereby the depressed portion is formed.

Figure 4A:
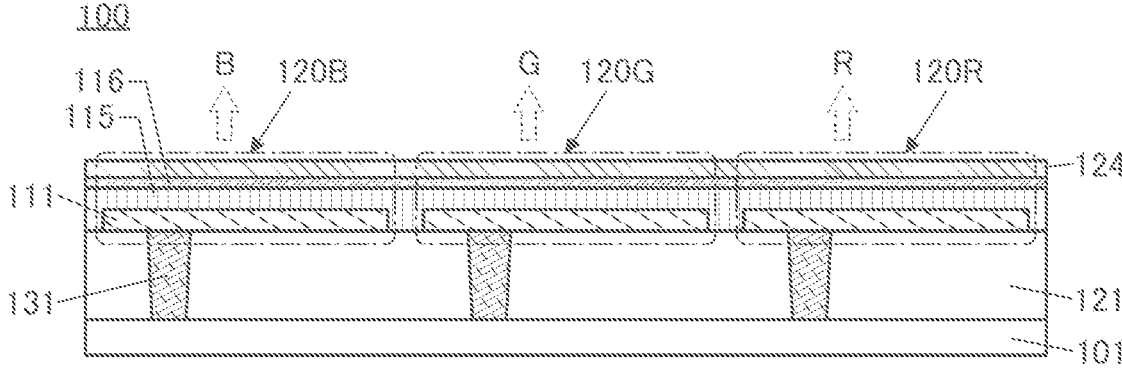
FIG. 4A and FIG. 4B are diagrams illustrating structure examples of a display device.

As illustrated in FIG. 4A, a light-emitting substance emitting white light may be employed as the EL layer 115 included in the light-emitting element 120. In that case, a coloring layer overlapping with the light-emitting element 120 may be provided as described later. When a light-emitting substance emitting white light is employed as the EL layer 115, the EL layer 115 preferably contains two or more kinds of light-emitting substances. White emission can be obtained by selecting two or more light-emitting substances so that the light-emitting substances emit light of complementary colors, for example. For example, it is preferable to contain two or more light-emitting substances emitting light of R (red), G (green), B (blue), Y (yellow), 0 (orange), and the like or light-emitting substances emitting light containing two or more spectral components of R, G, and B. A light-emitting element whose emission spectrum has two or more peaks in the wavelength range of a visible light region (e.g., 350 nm to 750 nm) is preferably employed. An emission spectrum of a material having a peak in a yellow wavelength range preferably has spectral components also in green and red wavelength ranges.

The EL layer 115 can have a structure in which a light-emitting layer containing a light-emitting material emitting light of one color and a light-emitting layer containing a light-emitting material emitting light of another color are stacked. For example, a plurality of light-emitting layers in the EL layer 115 may be stacked in contact with each other or may be stacked with a region including no light-emitting material therebetween. For example, between a fluorescent layer and a phosphorescent layer, a region that contains the same material as the fluorescent layer or the phosphorescent layer (for example, a host material or an assist material) and including no light-emitting material may be provided. This facilitates the fabrication of the light-emitting element and reduces the drive voltage.

The light-emitting element 120 may be a single element including one EL layer or a tandem element in which a plurality of EL layers are stacked with a charge-generation layer therebetween.

As illustrated in FIG. 4A, the EL layer 115 may be provided in common for the light-emitting elements 120. In FIG. 4A, the continuous EL layer 115 is provided to cover the conductive layer 111 of each light-emitting element 120. As illustrated in FIG. 4A, the conductive layer 116 may be provided in common for the light-emitting element 120R, the light-emitting element 120G, and the light-emitting element 120B. The conductive layer 116 functions as, for example, an electrode to which a common potential is applied. It is preferable to provide the conductive layer 116 in common because the fabrication steps of the light-emitting element 120 can be reduced.

Figure 4B:
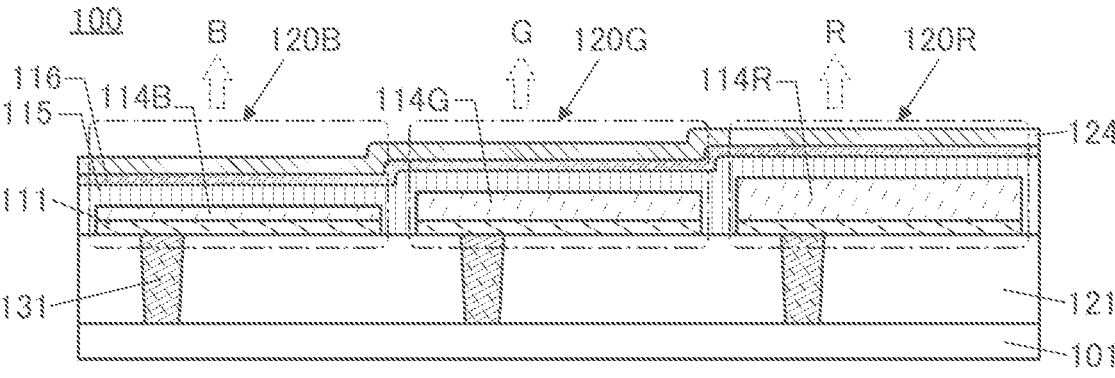

In the light-emitting element 120, a conductive layer 114 (which refers to the conductive layer 114B, the conductive layer 114G, and the conductive layer 114R) may be provided between the conductive layer 111 and the EL layer 115 as illustrated in FIG. 4B. The conductive layer 114 has a function of transmitting visible light.

As the conductive layer 114, a conductive film having a property of transmitting visible light described above can be used. As the conductive layer 114, a film which is thin enough to transmit visible light formed using a conductive film which reflects visible light described above can be used. In addition, with the stacked-layer structure of the conductive film and the conductive film transmitting visible light described above, the conductivity and the mechanical strength can be increased.

As illustrated in FIG. 4B, the conductive layer 114 is placed between the conductive layer 111 and the EL layer 115. The conductive layer 114 is positioned over the conductive layer 111. Here, the EL layer 115 is preferably provided to cover the end portions of the conductive layer 114.

As illustrated in FIG. 4B, the conductive layers 114 included in the light-emitting elements 120 preferably have different thicknesses from each other. Among the three conductive layers 114, the thickness of the conductive layer 114B is the smallest and the thickness of the conductive layer 114R is the largest. Here, the distance between the top surface of the conductive layer 111 and the bottom surface of the conductive layer 116 (i.e., the interface between the conductive layer 116 and the EL layer 115) is the largest in the light-emitting element 120R and the smallest in the light-emitting element 120B among the light-emitting elements. In each light-emitting element, by changing the distance between the top surface of the conductive layer 111 and the bottom surface of the conductive layer 116, optical distance (optical path length) of each light-emitting element can be changed.

Among the three light-emitting elements, the light-emitting element 120R has the longest optical path length, and thus emits light R that is the intensified light with the longest wavelength. In contrast, the light-emitting element 120B has the shortest optical path length, and thus emits light B that is the intensified light with the shortest wavelength. The light-emitting element 120G emits light G that is the intensified light with the intermediate wavelength. For example, the light R is the intensified red light, the light G is the intensified green light, and the light B is the intensified blue light.

With such a structure, the EL layer included in the light-emitting elements 120 need not be separately formed for the light-emitting elements of different colors; thus, color display with high color reproducibility can be performed using elements with the same structure. In addition, the light-emitting element 120 can be arranged extremely densely. For example, a display device having a resolution exceeding 5000 ppi can be achieved.

In each light-emitting element, the optical distance between the surface of the conductive layer 111 reflecting visible light and the conductive layer 116 having a semi-transmissive and a semi-reflective property with respect to visible light is preferably adjusted to mλ/2 (m is a natural number; however, m is not 0) or in the vicinity thereof with respect to wavelength λ whose intensity is desired to be increased.

Note that the above-described optical distance depends on a product of the physical distance between the reflective surface of the conductive layer 111 and the reflective surface of the conductive layer 116 having a semi-transmissive and a semi-reflective property and the refractive index of a layer provided therebetween, and thus is difficult to adjust exactly. Thus, it is preferable to adjust the optical distance on the assumption that the surface of the conductive layer 111 and the surface of the conductive layer 116 having a semi-transmissive and a semi-reflective property are each the reflective surface.

As described later, by providing the coloring layer which overlaps with the light-emitting element 120, color purity of light from the light-emitting element can be increased.

Note that the light-emitting layer 120 may have a structure in which a plurality of EL layers are stacked. For example, the EL layer 115 may have a structure in which the EL layer 115B containing a light-emitting substance emitting blue light, the EL layer 115G containing a light-emitting substance emitting green light, and the EL layer 115R containing a light-emitting substance emitting red light are stacked. The EL layers may each include an electron-injection layer, an electron-transport layer, a charge-generation layer, a hole-transport layer, and a hole-injection layer, for example, in addition to a layer containing a light-emitting compound. Note that a charge-generation layer may be provided between the EL layer 115B and the EL layer 115G. In addition, a charge-generation layer may be provided between the EL layer 115G and the EL layer 115R.

<Structure Examples of EL Layer>

Figures 17A, 17B, 17C, 17D:
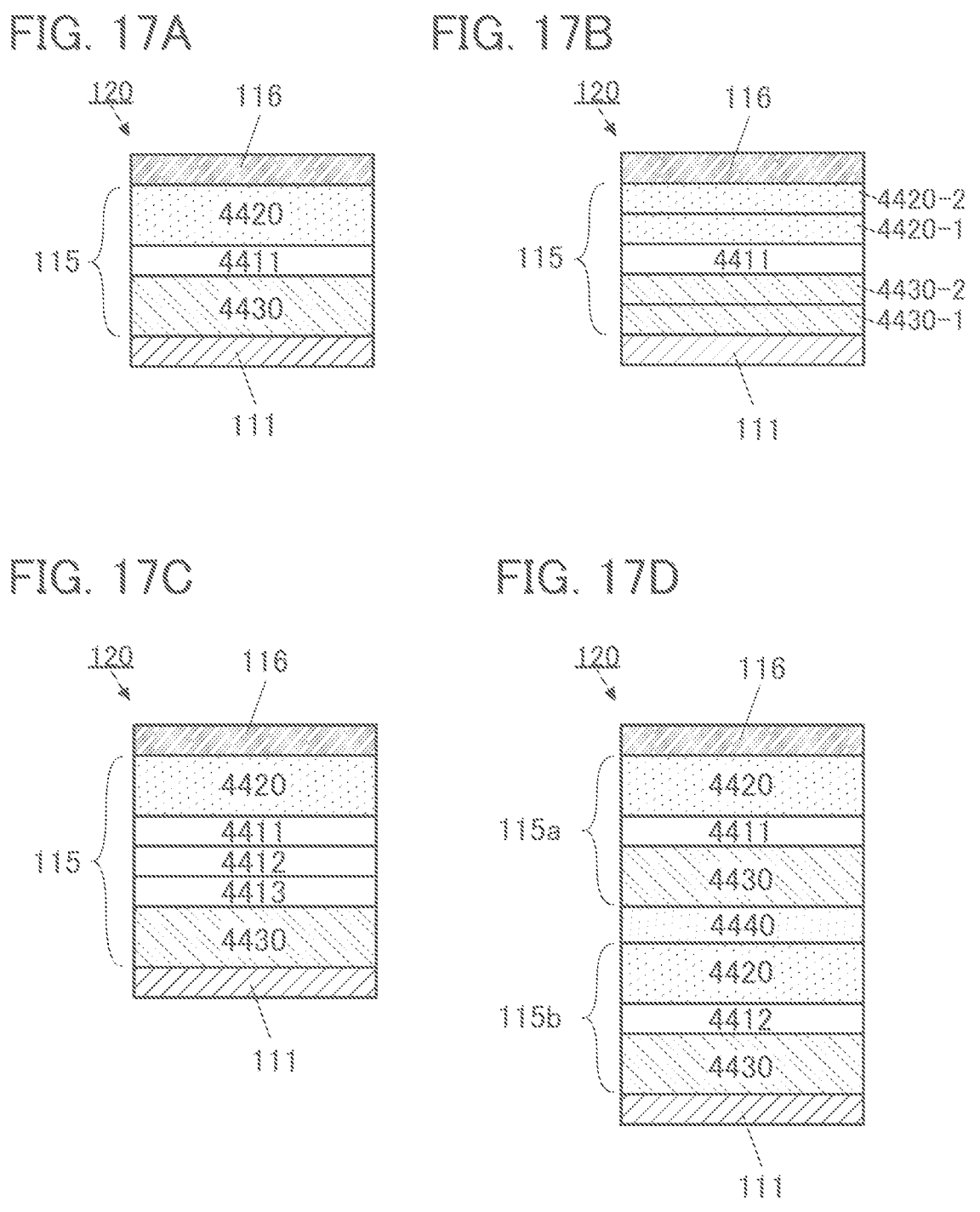

An EL layer 115 included in the light-emitting element 120 can be formed of a plurality of layers such as a layer 4420, a light-emitting layer 4411, and a layer 4430, as illustrated in FIG. 17A. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which are provided between a pair of electrodes, can serve as a single light-emitting unit, and the structure in FIG. 17A is referred to as a single structure in this specification.

FIG. 17B is a modification example of the EL layer 115 included in the light-emitting element 120 illustrated in FIG. 17A. Specifically, the light-emitting element 120 illustrated in FIG. 17B includes a layer 4430-1 over the conductive layer 111, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 116 over the layer 4420-2. For example, when the conductive layer 111 is an anode and the conductive layer 116 is a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductive layer 111 is a cathode and the conductive layer 116 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be increased.

Note that the structure in which a plurality of light-emitting layers (light-emitting layers 4411, 4412, and 4413) are provided between the layer 4420 and the layer 4430 as illustrated in FIG. 17C is a variation of the single structure.

The structure in which a plurality of light-emitting units (EL layers 115a and 115b) are connected in series with an intermediate layer (charge-generation layer) 4440 therebetween as illustrated in FIG. 17D is referred to as a tandem structure in this specification. Note that in this specification and the like, the structure illustrated in FIG. 17D is referred to as a tandem structure; however, without being limited to this, a tandem structure may be referred to as a stack structure, for example. The tandem structure enables a light-emitting element capable of high-luminance light emission.

Note that also in FIG. 17C and FIG. 17D, the layer 4420 and the layer 4430 may each have a stacked-layer structure of two or more layers as illustrated in FIG. 17B.

The emission color of the light-emitting element can be red, green, blue, cyan, magenta, yellow, white, or the like depending on the material included in the EL layer 115. Furthermore, the color purity can be further increased when the light-emitting element has a microcavity structure.

The light-emitting element that emits white light preferably contains two or more kinds of light-emitting substances in the light-emitting layer. To obtain white light emission, two or more light-emitting substances may be selected so that their emission colors are complementary.

The light-emitting layer preferably contains two or more light-emitting substances that emit light of R (red), G (green), B (blue), Y (yellow), 0 (orange), and the like. Alternatively, the light-emitting layer preferably contains two or more light-emitting substances that each emit light containing two or more spectral components of R, G, and B.

A specific structure example of the light-emitting element will be described below.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer injecting holes from an anode to a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials having a high hole-transport property, such as a $\pi$-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by an electron-injection layer, to a light-emitting layer. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a $\pi$-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used.

Alternatively, as the above-described electron-injection layer, an electron-transport material may be used. For example, a compound having an unshared electron pair and having an electron deficient heteroaromatic ring skeleton can be used as the material having an electron-transport property. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level can be estimated by CV (cyclic voltammetry), photo-electron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

[Fabrication Method Example]

An example of a fabrication method of the display device of one embodiment of the present invention will be described with reference to drawings.

Note that thin films included in the display device (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

Alternatively, thin films included in the display device (insulating films, semiconductor films, conductive films, or the like) can be formed by a method such as spin coating, dipping, spray coating, ink jetting, dispensing, screen printing, offset printing, a doctor knife, a slit coater, a roll coater, a curtain coater, and a knife coater.

When the thin films included in the display device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by a liquid immersion exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask need not be used.

For etching of the thin film, a dry etching method, a wet etching method, a sandblasting method, or the like can be used.

Examples of a fabrication method of the display device illustrated in FIG. 1B will be described with reference to FIG. 5A to FIG. 5D and FIG. 6A to FIG. 6D. By using the fabrication method illustrated in FIG. 5A to FIG. 5D and FIG. 6A to FIG. 6D, the processing of the EL layer 115 and the conductive layer 116 can be performed without using a metal mask.

[Preparation for Substrate 101]

As the substrate 101, a substrate having at least heat resistance high enough to withstand later heat treatment can be used. When an insulating substrate is used as the substrate 101, a glass substrate, a quartz substrate, a sapphire substrate, a ceramic substrate or the like can be used. Alternatively, a single crystal semiconductor substrate or a polycrystalline semiconductor substrate using silicon or silicon carbide as a material, a compound semiconductor substrate of silicon germanium or the like, a semiconductor substrate such as an SOI substrate, or the like can be used.

As the substrate 101, it is particularly preferable to use a semiconductor substrate or an insulating substrate over which a semiconductor circuit including a semiconductor element such as a transistor is formed. Such a semiconductor element may be formed using a semiconductor substrate such as a single crystal silicon substrate or may be formed using an oxide semiconductor film. The semiconductor circuit preferably forms, for example, a pixel circuit, a gate line driver circuit (a gate driver), or a source line driver circuit (a source driver). In addition to the above, an arith-metic circuit, a memory circuit, or the like may be formed.

In this embodiment, a substrate including at least a pixel circuit is used as the substrate 101.

[Deposition of Insulating Layer 121]

Figure 5A:
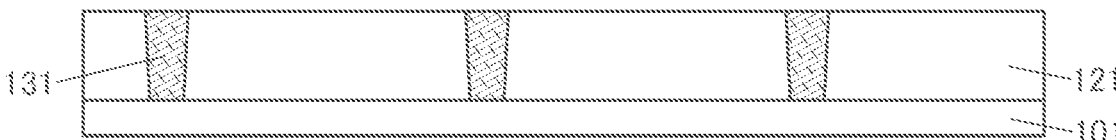
FIG. 5A to FIG. 5D are diagrams illustrating an example of a fabrication method of a display device.
Figure 5B:
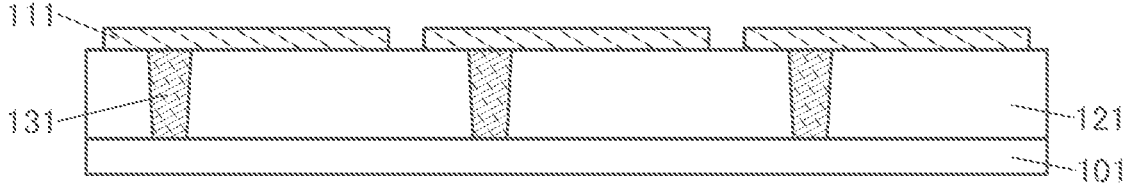
Figure 5C:
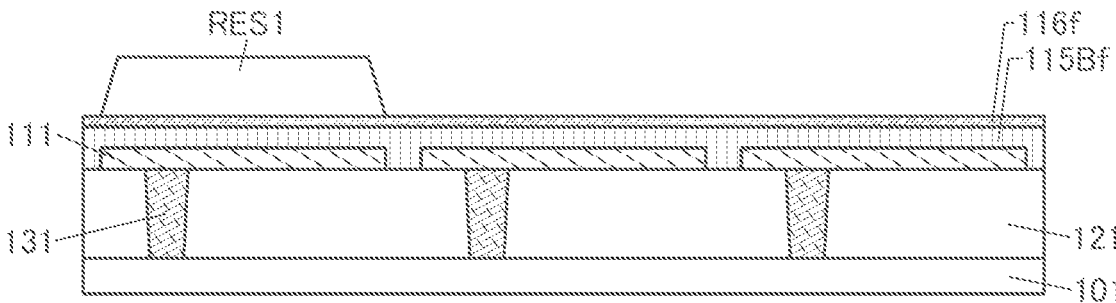

The insulating layer 121 is deposited over the substrate 101 (see FIG. 5A). The insulating layer 121 can be appro-priately formed using any of the above insulating materials and any of the above deposition methods.

Note that when the structure illustrated in FIG. 1C is formed, the insulating layer 122 may be deposited over the insulating layer 121. The insulating layer 122 can be appro-priately formed using any of the above insulating materials and any of the above deposition methods. Here, when the insulating layer 122 is formed using a material with a low etching rate, the insulating layer 122 can function as an etching stopper at the time of forming the conductive layer 111, the EL layer 115, and the conductive layer 116.

[Formation of Plug 131]

An opening reaching the substrate 101 is formed in the insulating layer 121 in a position where the plug 131 is to be formed. The opening is preferably an opening reaching an electrode or a wiring provided in the substrate 101. Then, a conductive film is formed to fill the opening and planariza-tion treatment is performed to expose the top surface of the insulating layer 121. Thus, the plug 131 embedded in the insulating layer 121 can be formed (see FIG. 5A).

[Formation of Conductive Layer 111]

A conductive film is formed over the insulating layer 121 and the plug 131. The conductive film is processed into an island shape to form the conductive layer 111 (see FIG. 5B). The conductive layer 111 is electrically connected to the plug 131. Here, in a region of the insulating layer 121, which does not overlap with the conductive layer 111, a depressed portion is formed in some cases.

[Formation of EL Layer 115 and Conductive Layer 116]

Subsequently, the EL layer 115Bf and the conductive layer 116f of the light-emitting element 120B are deposited in this order over the conductive layer 111 and the insulating layer 121. Next, a pattern using a resist RES1 is formed over the conductive layer 116f (see FIG. 5C). Here, the EL layer 115Bf is a layer to be the EL layer 115B in a later step. The conductive layer 116f is a layer to be the conductive layer 116 in a later step. In addition, the EL layer 115Gf and the EL layer 115Rf which are formed later and the EL layer 115Bf are collectively referred to as an EL layer 115f in some cases.

The EL layer 115f includes at least a layer containing a light-emitting compound. In addition to this, a structure in which an electron-injection layer, an electron-transport layer, a charge-generation layer, a hole-transport layer, and a hole-injection layer are stacked may be employed. The EL layer 115f can be formed by, for example, a liquid phase method such as an evaporation method or an inkjet method.

The conductive layer 116f is formed to have a transmissive property and a reflective property with respect to visible light. For example, a metal film or an alloy film which is thin enough to transmit visible light can be used. Alternatively, a conductive film (e.g., a metal oxide film) having a light-transmitting property may be stacked over such a film.

Figure 5D:
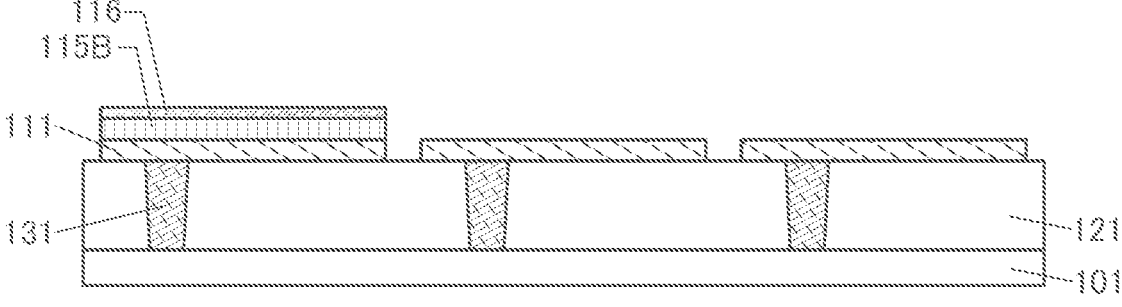

Subsequently, after etching is performed using the resist RES1 as a mask and the conductive layer 116 and the EL layer 115B are formed in this order, the resist RES1 is removed (see FIG. 5D).

Here, when the EL layer 115Bf is etched, chlorine or the like used in an etching gas is attached to the side surface of the EL layer 115B in some cases. In addition, by the removal of the resist RES1 after the conductive layer 116 and the EL layer 115B are formed or by an exposure of the conductive layer 116 and the EL layer 115B to the air, impurities such as water or oxygen are adsorbed on the side surface of the EL layer 115B in some cases. The same applies to the EL layer 115G and the EL layer 115R, which are described later.

Subsequently, the EL layer 115Gf and the conductive layer 116f of the light-emitting element 120G are deposited in this order over the conductive layer 111, the insulating layer 121, and the conductive layer 116 of the light-emitting element 120B. Next, a pattern using a resist RES2 is formed over the conductive layer 116f (see FIG. 6A). Here, the EL layer 115Gf is a layer to be the EL layer 115G in a later step.

Next, after etching is performed using the resist RES2 as a mask and the conductive layer 116 and the EL layer 115G are formed in this order, the resist RES2 is removed.

Subsequently, the EL layer 115Rf and the conductive layer 116f of the light-emitting element 120R are deposited in this order over the conductive layer 111, the insulating layer 121, the conductive layer 116 of the light-emitting element 120B, and the conductive layer 116 of the light-emitting element 120G. Next, a pattern using a resist RES3 is formed over the conductive layer 116f (see FIG. 6B). Here, the EL layer 115Rf is a layer to be the EL layer 115R in a later step.

Figure 6A:
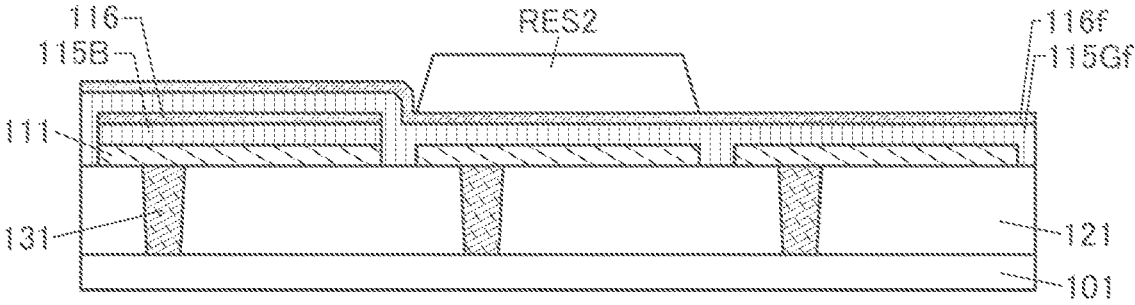
FIG. 6A to FIG. 6D are diagrams illustrating an example of a fabrication method of a display device.
Figure 6B:
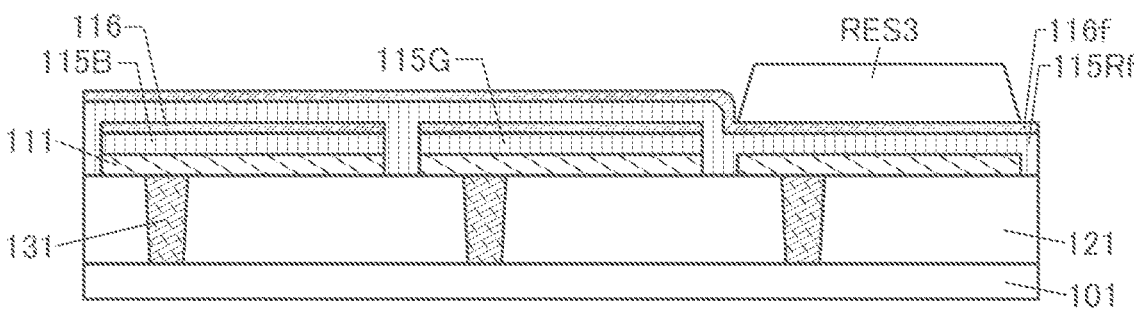
Figure 6C:
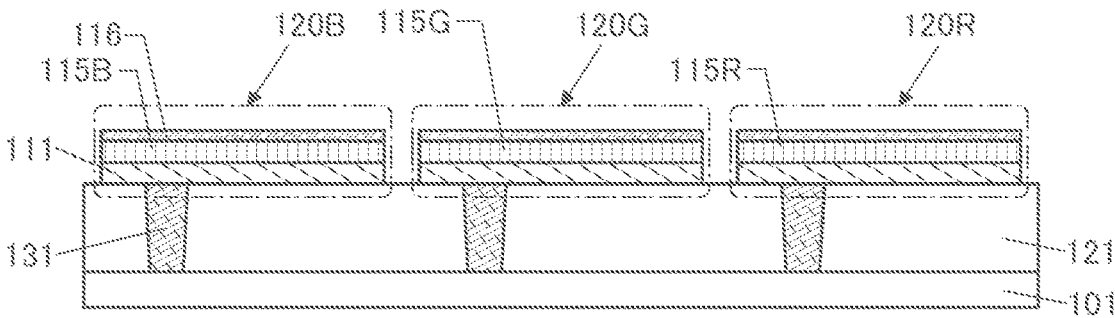

Next, after etching is performed using the resist RES3 as a mask and the conductive layer 116 and the EL layer 115R are formed in this order, the resist RES3 is removed (see FIG. 6C).

Note that although the EL layer 115 and the conductive layer 116 are formed after the conductive layer 111 is formed in this embodiment, the present invention is not limited thereto. For example, a process in which a layer to be the conductive layer 111, the EL layer 115f, and the conductive layer 116f are deposited in this order, and then the layers are collectively processed into an island shape to form the conductive layer 111, the EL layer 115, and the conductive layer 116 can also be employed.

In this embodiment, the EL layer 115f and the conductive layer 116f are successively deposited in each light-emitting element 120; however, the present invention is not limited thereto. The conductive layer 116 may be formed after the formation of the EL layer 115 only, by a method similar to that illustrated in FIG. 5C to FIG. 6C. In this case, the conductive layer 116 can be processed to be continuous without being separated between the light-emitting element 120B, the light-emitting element 120G, and the light-emitting element 120R.

Alternatively, after the formation of a portion of the EL layer 115 in a method similar to that illustrated in FIG. 5C to FIG. 6C, the other portions of the EL layer 115 and the conductive layer 116 may be formed. For example, the electron injection layer of the EL layer 115 and the conductive layer 116 may be formed later. In this case, the electron injection layer of the EL layer 115 and the conductive layer 116 can be processed to be continuous without being separated between the light-emitting element 120B, the light-emitting element 120G, and the light-emitting element 120R.

Here, when a resist is directly formed over the EL layer 115f, a solvent of the resist might deteriorate the EL layer 115f. Therefore, it is preferable that an inorganic film functioning as a sacrifice layer be provided between the EL layer 115f and the resist so that the resist is not in direct contact with the EL layer 115f. For example, when the EL layer 115 has a structure illustrated in FIG. 17B, an inorganic film functioning as a sacrifice layer may be provided over the layer 4420-1 functioning as an electron-transport layer, a resist may be provided thereover, and then the layer 4430-1, the layer 4430-2, the light-emitting layer 4411, and the layer 4420-1 may be etched.

[Deposition of Insulating Layer 124]

Figure 6D:
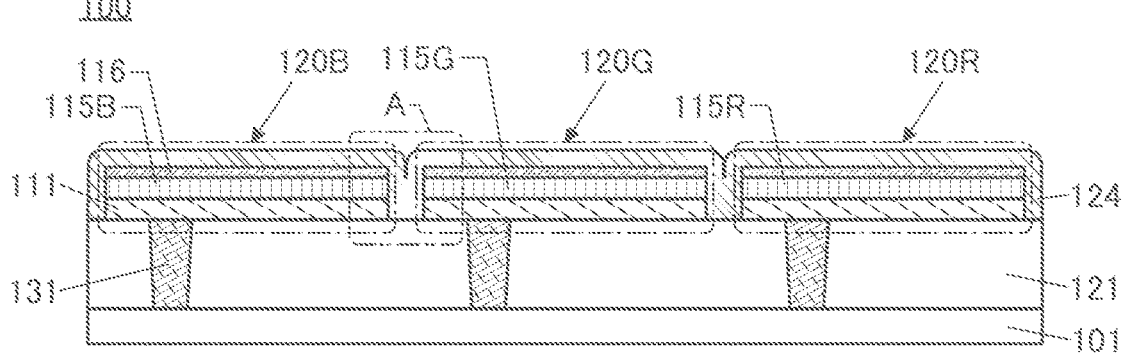

Next, the insulating layer 124 is deposited over the insulating layer 121 and the conductive layer 116 (see FIG. 6D). The insulating layer 124 can be appropriately formed using any of the above insulating materials and any of the above deposition methods. Note that a deposition temperature of the insulating layer 124 is preferably in a range in which the EL layer 115 does not deteriorate; for example, in the range of room temperature to 100° C., inclusive.

Figure 7A:
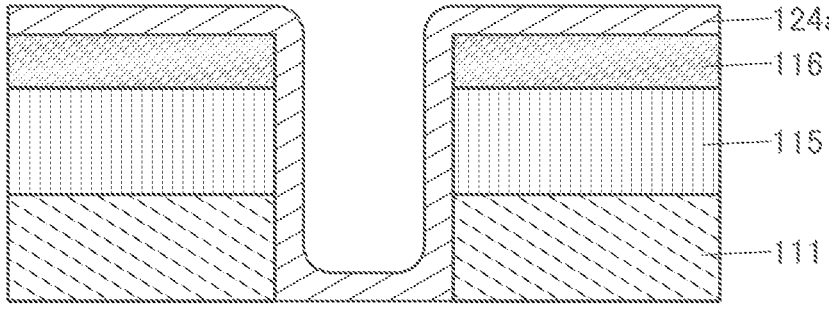
FIG. 7A to FIG. 7C are diagrams illustrating an example of a fabrication method of a display device.
Figure 7B:
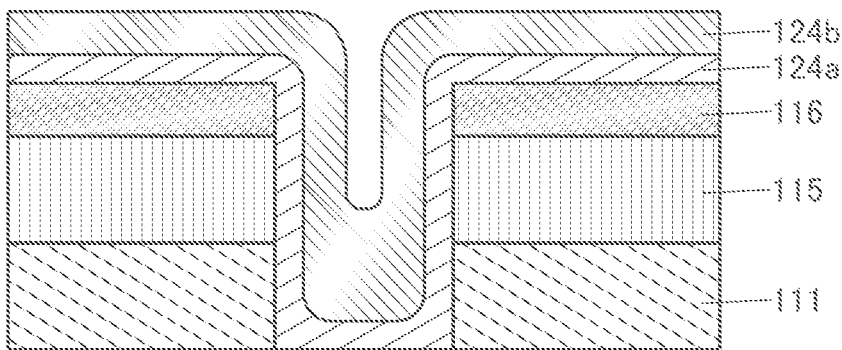
Figure 7C:
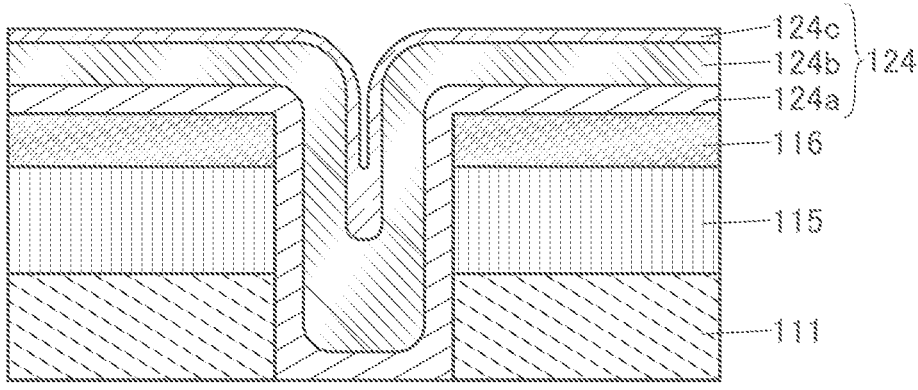

Here, a step of forming the insulating layer 124 using FIG. 7A to FIG. 7C which are enlarged views of a region A in FIG. 6D is described.

First, the layer 124a is deposited to cover the insulating layer 121, the conductive layer 111, the EL layer 115, and the conductive layer 116 (see FIG. 7A). The layer 124a can be appropriately formed using any of the above insulating materials and any of the above deposition methods. For example, aluminum oxide may be deposited by a sputtering method. Here, it is preferable that the amount of oxygen in the deposition gas be decreased or oxygen be not contained in the deposition gas. Thus, oxygen vacancies in the layer 124a are increased, and the function of capturing or fixing impurities such as water or oxygen in the layer 124a can be further enhanced.

Next, the layer 124b is deposited to cover the layer 124a (see FIG. 7B). The layer 124b can be appropriately formed using any of the above insulating materials and any of the above deposition methods. For example, silicon nitride may be deposited using a sputtering method.

Next, the layer 124c is deposited to cover the layer 124b (see FIG. 7C). The layer 124c can be appropriately formed using any of the above insulating materials and any of the above deposition methods. For example, aluminum oxide may be deposited by an ALD method.

As described above, in the etching step, impurities such as water or oxygen or impurities such as chlorine used in the etching may be attached to the light-emitting element 120, especially, the side surfaces of the EL layer 115B, the EL layer 115G, and the EL layer 115R. In that case, by providing the insulating layer 124 as described above, these impurities can be captured by or fixed in the layer 124a. Thus, the formation of an unintended layer on the side surface of the EL layer 115 by the impurities is prevented, whereby the light-emitting element 120 can have improved reliability.

Through the above steps, the display device 100 including the light-emitting element 120R, the light-emitting element 120G, and the light-emitting element 120B can be fabricated.

Structure Example 2

An example of the display device including a transistor will be described below.

Structure Example 2-1

Figures 8A, 8B:
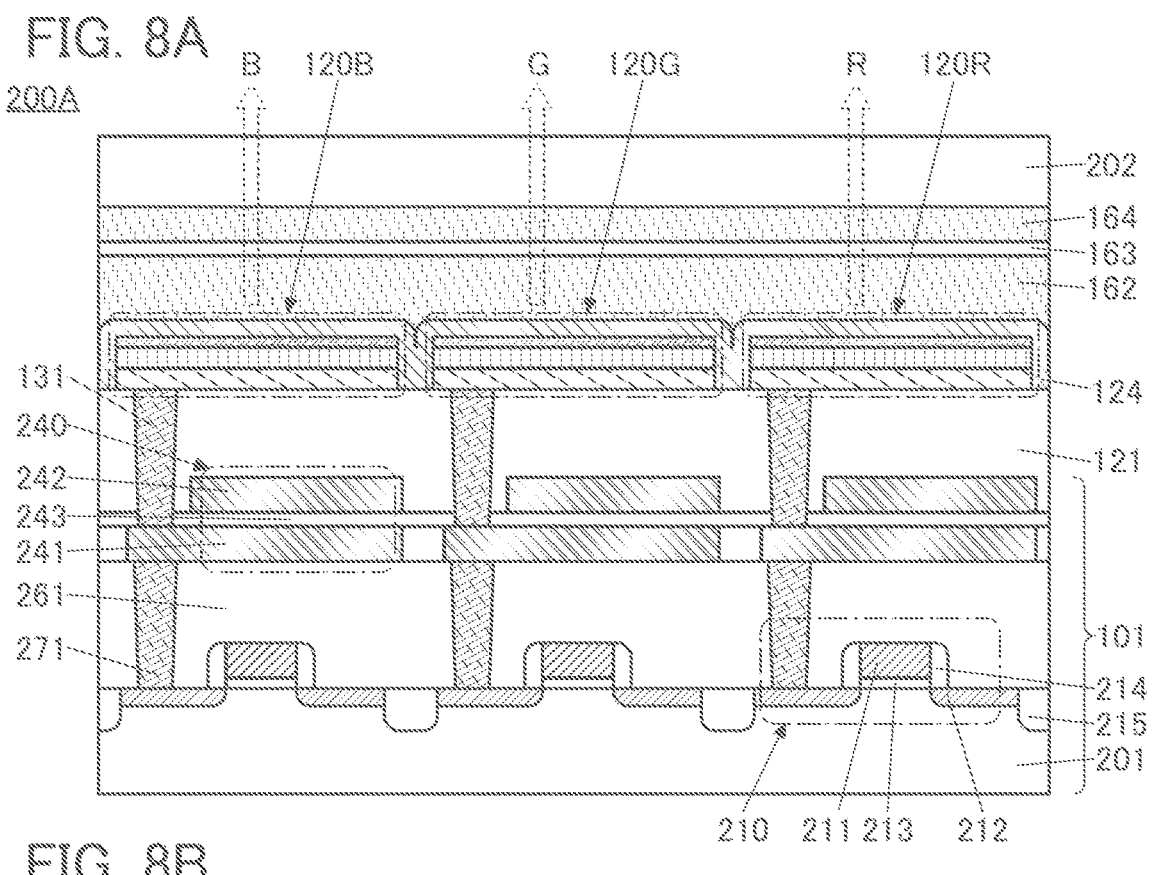
FIG. 8A and FIG. 8B are diagrams illustrating structure examples of a display device.

FIG. 8A is a schematic cross-sectional view of a display device 200A.

The display device 200A includes a substrate 201, the light-emitting element 120R, the light-emitting element 120G, the light-emitting element 120B, a capacitor 240, a transistor 210, and the like.

A stacked structure from the substrate 201 to the capacitor 240 corresponds to the substrate 101 in the above-described structure example 1.

The transistor 210 is a transistor whose channel formation region is formed in the substrate 201. As the substrate 201, a semiconductor substrate such as a single crystal silicon substrate can be used, for example. The transistor 210 includes part of the substrate 201, a conductive layer 211, a low-resistance region 212, an insulating layer 213, and an insulating layer 214. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover a side surface of the conductive layer 211 and functions as an insulating layer.

In addition, an element isolation layer 215 is provided between two adjacent transistors 210 to be embedded in the substrate 201.

Furthermore, an insulating layer 261 is provided to cover the transistor 210, and the capacitor 240 is provided over the insulating layer 261.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode of the capacitor 240, and the insulating layer 243 functions as a dielectric of the capacitor 240.

The conductive layer 241 is provided over the insulating layer 261 and is electrically connected to one of the source and the drain of the transistor 210 through a plug 271 embedded in the insulating layer 261. The insulating layer 243 is provided to cover the conductive layer 241. The conductive layer 242 is provided in a region overlapping with the conductive layer 241 with the insulating layer 243 therebetween.

The insulating layer 121 is provided to cover the capacitor 240, and the light-emitting element 120R, the light-emitting element 120G, the light-emitting element 120B, and the like are provided over the insulating layer 121. Here, an example of the structure is illustrated in FIG. 1A as the structure of the light-emitting element 120R, the light-emitting element 120G, the light-emitting element 120B, and the like; however, the structure is not limited thereto and a variety of structures described above can be employed.

In the display device 200A, the insulating layer 124, an insulating layer 162, and an insulating layer 163 are provided in this order to cover the conductive layer 116 of the light-emitting element 120. These three insulating layers each function as a protective layer which inhibits diffusion of impurities such as water into the light-emitting element 120. As the insulating layer 163, it is preferable to use an inorganic insulating film with low moisture permeability, such as a silicon oxide film, a silicon nitride film, or an aluminum oxide film. As the insulating layer 162, an organic insulating film having a high light-transmitting property can be used. Using an organic insulating film as the insulating layer 162 can reduce the influence of uneven shape below the insulating layer 162, so that the formation surface of the insulating layer 163 can be a smooth surface. Accordingly, a defect such as a pinhole is unlikely to be generated in the insulating layer 163, leading to higher moisture permeability of the protective layer. Note that the structure of the protective layer covering the light-emitting element 120 is not limited thereto, and a single layer or a two-layer structure may be employed or a stacked-layer structure of four or more layers may be employed.

Providing the insulating layer 124 can inhibit diffusion of impurities such as water or oxygen into the light-emitting element 120 as described in the above structure examples.

The display device 200A includes the substrate 202 on the viewing side. The substrate 202 and the substrate 201 are bonded to each other with an adhesive layer 164 which has a light-transmitting property. As the substrate 202, a substrate having a light-transmitting property such as a glass substrate, a quartz substrate, a sapphire substrate, or a plastic substrate can be used.

In the case of using light-emitting elements which emit white light as illustrated in FIG. 4A and FIG. 4B, the coloring layer 165R, the coloring layer 165G, and the coloring layer 165B are preferably provided as illustrated in FIG. 8B. A coloring layer 165R overlapping with the light-emitting element 120R, a coloring layer 165G overlapping with the light-emitting element 120G, and a coloring layer 165B overlapping with the light-emitting element 120B are provided over the insulating layer 163. For example, the coloring layer 165R transmits red light, the coloring layer 165G transmits green light, and the coloring layer 165B transmits blue light. This can increase the color purity of light from each of the light-emitting elements, so that a display device with higher display quality can be achieved. Furthermore, forming the coloring layers over the insulating layer 163 makes it easy to align the light-emitting units with the respective coloring layers as compared with the case, which is described later, where the coloring layers are formed over a substrate 202, so that a display device with extremely high resolution can be achieved. Note that the structure is not limited to the above, and the coloring layer 165R, the coloring layer 165G, and the coloring layer 165B may be provided even when the light-emitting elements are divided into elements which emit red light, green light, and blue light.

With such a structure, a display device with extremely high resolution and high display quality can be achieved.

Structure Example 2-2

Figure 9:
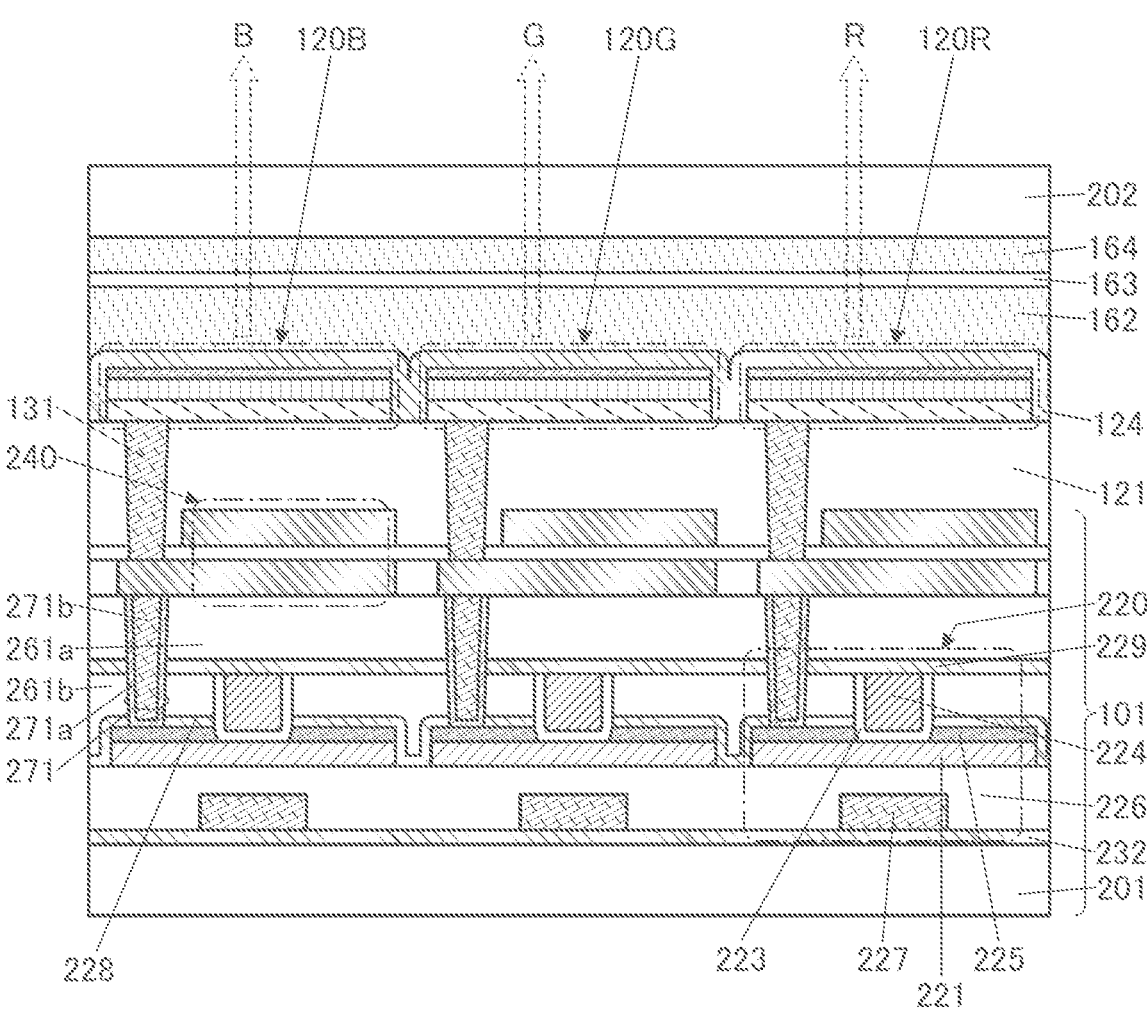
FIG. 9 is a diagram illustrating a structure example of a display device.

FIG. 9 is a schematic cross-sectional view of a display device 200B. The display device 200B is different from the display device 200A mainly in a transistor structure.

A transistor 220 is a transistor in which a metal oxide (also referred to as an oxide semiconductor) is used in a semiconductor layer where a channel is formed.

The transistor 220 includes a semiconductor layer 221, an insulating layer 223, a conductive layer 224, a pair of conductive layers 225, an insulating layer 226, and a conductive layer 227.

As the substrate 201 over which the transistor 220 is provided, the above-described insulating substrate or semiconductor substrate can be used.

An insulating layer 232 is provided over the substrate 201. The insulating layer 232 functions as a barrier layer that prevents diffusion of impurities such as water or hydrogen from the substrate 201 into the transistor 220 and release of oxygen from the semiconductor layer 221 to the insulating layer 232 side. As the insulating layer 232, for example, a film in which hydrogen or oxygen, such as an aluminum oxide film, a hafnium oxide film, and a silicon nitride film, is unlikely to be diffused than in a silicon oxide film can be used.

The conductive layer 227 is provided over the insulating layer 232, and the insulating layer 226 is provided to cover the conductive layer 227. The conductive layer 227 functions as the first gate electrode of the transistor 220, and part of the insulating layer 226 functions as the first gate insulating layer. For at least part of the insulating layer 226 that is in contact with the semiconductor layer 221, an oxide insulating film such as a silicon oxide film is preferably used. The top surface of the insulating layer 226 is preferably planarized.

The semiconductor layer 221 is provided over the insulating layer 226. The semiconductor layer 221 preferably includes a film of a metal oxide exhibiting semiconductor characteristics (also referred to as an oxide semiconductor). The material that can be favorably used for the semiconductor layer 221 is described later in detail.

The pair of conductive layers 225 is provided over and in contact with the semiconductor layer 221, and functions as a source electrode and a drain electrode.

An insulating layer 228 is provided to cover the top surface and a side surface of the pair of conductive layers 225, a side surface of the semiconductor layer 221, and the like, and an insulating layer 261b is provided over the insulating layer 228. The insulating layer 228 functions as a barrier layer that prevents diffusion of impurities such as water or hydrogen from the insulating layer 261b or the like into the semiconductor layer 221 and release of oxygen from the semiconductor layer 221. As the insulating layer 228, an insulating film similar to the insulating layer 232 can be used.

An opening reaching the semiconductor layer 221 is provided in the insulating layer 228 and the insulating layer 261b. The insulating layer 223 that is in contact with side surfaces of the insulating layer 261b, the insulating layer 228, and the conductive layer 225 and the top surface of the semiconductor layer 221; and the conductive layer 224 are embedded in the opening. The conductive layer 224 functions as the second gate electrode and the insulating layer 223 functions as the second gate insulating layer.

The top surface of the conductive layer 224, the top surface of the insulating layer 223, and the top surface of the insulating layer 261b are planarized so that they are substantially level with each other, and an insulating layer 229 and an insulating layer 261a are provided to cover these layers.

The insulating layer 261a and the insulating layer 261b function as an interlayer insulating layer. The insulating layer 229 functions as a barrier layer that prevents diffusion of impurities such as water or hydrogen from the insulating layer 261a or the like into the transistor 220. As the insulating layer 229, an insulating film similar to the insulating layer 228 and the insulating layer 232 can be used.

A plug 271 electrically connected to one of the pair of conductive layers 225 is provided to be embedded in the insulating layer 261a, an insulating layer 229, and an insulating layer 261b. Here, the plug 271 preferably includes a conductive layer 271a covering side surfaces of the opening in the insulating layer 261a, the insulating layer 261b, the insulating layer 229, and the insulating layer 228 and part of the top surface of the conductive layer 225; and a conductive layer 271b in contact with the top surface of the conductive layer 271a. In this case, a conductive material in which hydrogen and oxygen are unlikely to be diffused is preferably used for the conductive layer 271a.

Providing the insulating layer 122 or the insulating layer 124 can inhibit diffusion of impurities such as water or hydrogen into the transistor 220 as described in the above embodiments. Thus, the transistor 220 can have improved electrical characteristics and reliability.

Structure Example 2-3

Figure 10:
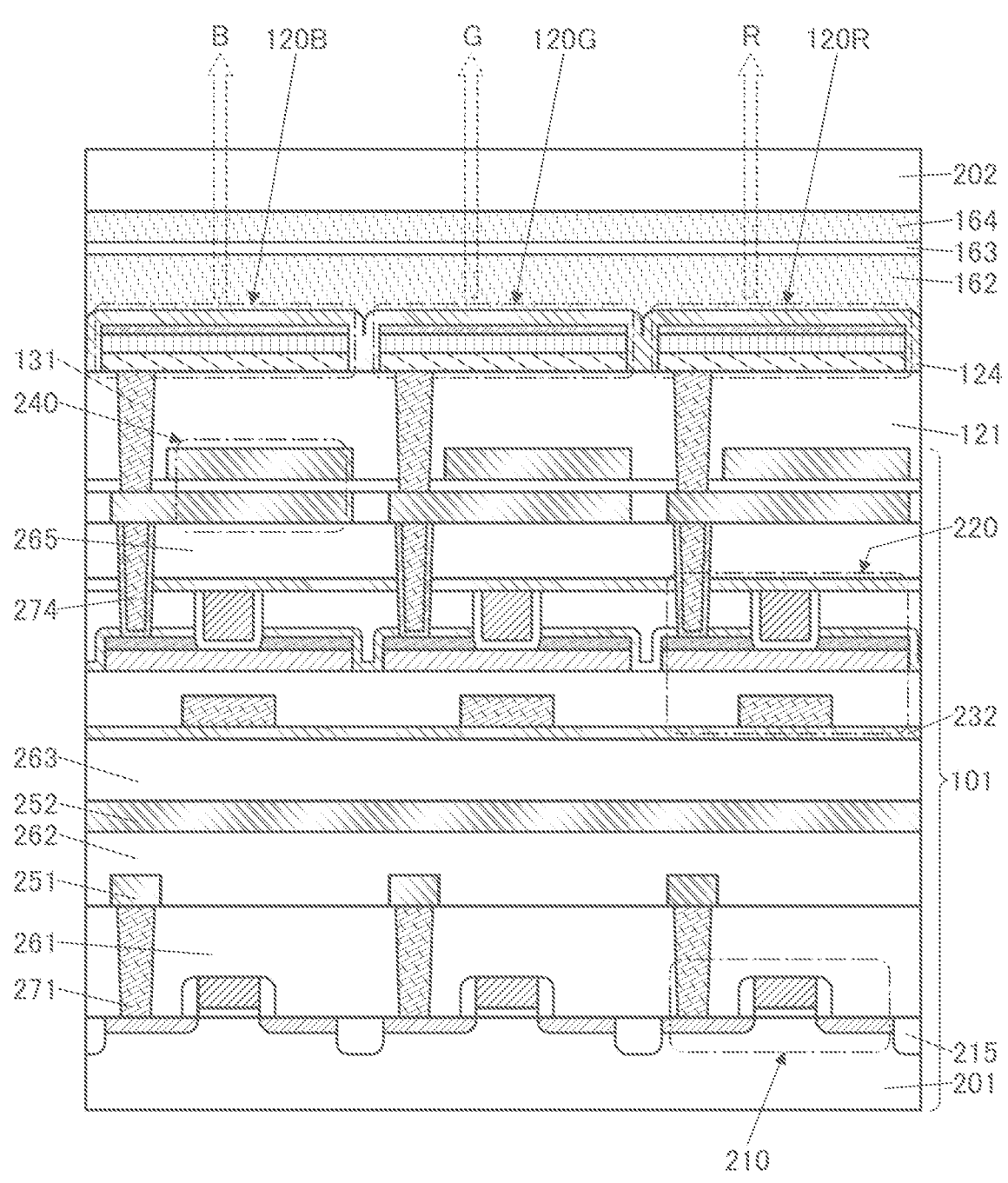
FIG. 10 is a diagram illustrating a structure example of a display device.

FIG. 10 is a schematic cross-sectional view of a display device 200C. The display device 200C has a structure in which the transistor 210 whose channel is formed in the substrate 201 and the transistor 220 including a metal oxide in a semiconductor layer where its channel is formed are stacked.

The insulating layer 261 is provided to cover the transistor 210 and the conductive layer 251 is provided over the insulating layer 261. In addition, an insulating layer 262 is provided to cover the conductive layer 251 and a conductive layer 252 is provided over the insulating layer 262. The conductive layer 251 and the conductive layer 252 each function as wirings. An insulating layer 263 and the insulating layer 232 are provided to cover the conductive layer 252, and the transistor 220 is provided over the insulating layer 232. An insulating layer 265 is provided to cover the transistor 220, and the capacitor 240 is provided over the insulating layer 265. The capacitor 240 and the transistor 220 are electrically connected to each other through a plug 274.

The transistor 220 can be used as a transistor included in a pixel circuit. The transistor 210 can also be used as a transistor included in a pixel circuit or a transistor included in a driver circuit (a gate line driver circuit or a source line driver circuit) for driving the pixel circuit. The transistor 210 and the transistor 220 can also be used as transistors included in a variety of circuits such as an arithmetic circuit or a memory circuit.

With such a structure, not only the pixel circuit but also the driver circuit or the like can be formed directly under the light-emitting unit; thus, the display device can be downsized as compared with the case where the driver circuit is provided around a display region.

Structure Example 2-4

Figure 11:
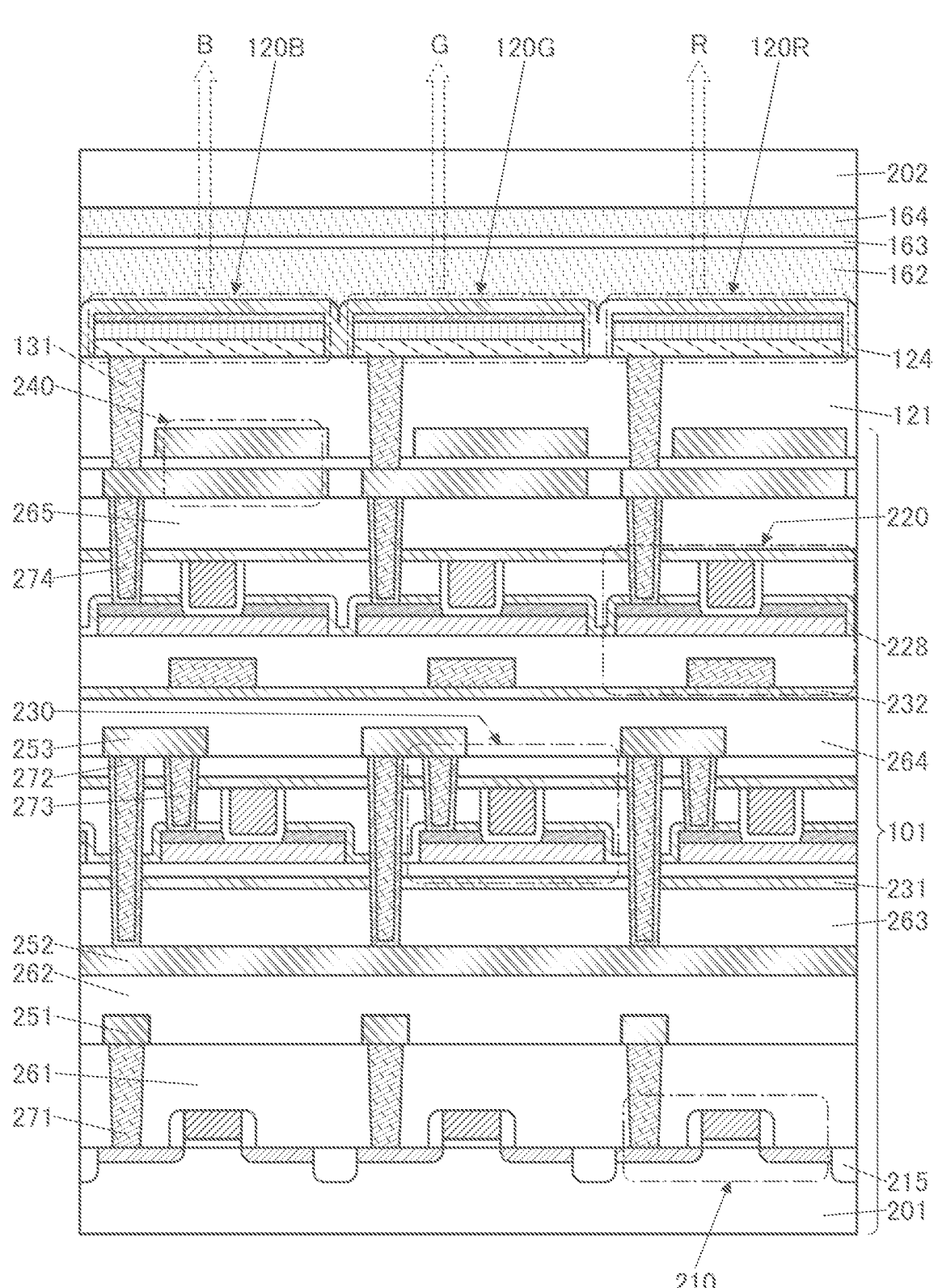
FIG. 11 is a diagram illustrating a structure example of a display device.

FIG. 11 is a schematic cross-sectional view of a display device 200D. The display device 200D is different from the display device 200C mainly in that two transistors using an oxide semiconductor are stacked.

The display device 200D includes a transistor 230 between the transistor 210 and the transistor 220. The transistor 230 has a structure similar to that of the transistor 220 except that the first gate electrode is not included. Note that the transistor 230 may have a structure including the first gate electrode.

The insulating layer 263 and an insulating layer 231 are provided to cover the conductive layer 252, and the transistor 230 is provided over the insulating layer 231. The transistor 230 and the conductive layer 252 are electrically connected to each other through a plug 273, a conductive layer 253, and a plug 272. An insulating layer 264 and the insulating layer 232 are provided to cover the conductive layer 253, and the transistor 220 is provided over the insulating layer 232.

The transistor 220 functions as, for example, a transistor for controlling current flowing through the light-emitting element 120. The transistor 230 functions as a selection transistor for controlling the selection state of a pixel. The transistor 210 functions as a transistor included in a driver circuit for driving a pixel, for example.

When three or more layers in which a transistor is formed are stacked in this manner, the area occupied by the pixel can be further reduced and a high-resolution display device can be achieved.

Components such as a transistor that can be employed in the display device will be described below.
[Transistor]

The transistor includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. In addition, the transistor structure may be either a top-gate structure or a bottom-gate structure. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used because deterioration of the transistor characteristics can be inhibited.

In particular, a transistor in which a metal oxide film is used for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor in which a metal oxide having a wider band gap and a lower carrier density than silicon is used has a low off-state current; thus, charges accumulated in a capacitor that is connected in series with the transistor can be held for a long time.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

When the metal oxide contained in the semiconductor layer is an In-M-Zn-based oxide, it is preferable that the atomic ratio of metal elements of a sputtering target used for depositing the In-M-Zn oxide satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements contained in the sputtering target in a range of ±40%.

A metal oxide film with a low carrier density is used as the semiconductor layer. For example, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such a metal oxide is referred to as a highly purified intrinsic or substantially highly purified intrinsic metal oxide. The oxide semiconductor has a low density of defect states and can be regarded as a metal oxide having stable characteristics.

Note that the composition is not limited to those, and an oxide semiconductor having an appropriate composition may be used depending on required semiconductor characteristics and electrical characteristics (field-effect mobility, threshold voltage, or the like) of the transistor. In addition, to obtain the required semiconductor characteristics of the transistor, it is preferable that the carrier density, impurity concentration, defect density, atomic ratio between a metal element and oxygen, an interatomic distance, a density, and the like of the semiconductor layer be set to be appropriate.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration (concentration obtained by secondary ion mass spectrometry) of silicon or carbon in the semiconductor layer is set lower than or equal to $2\times10^{18}$ atoms/$cm^3$, preferably lower than or equal to $2\times10^{17}$ atoms/$cm^3$.

Alkali metal and alkaline earth metal might generate carriers when bonded to a metal oxide, in which case the off-state current of the transistor might be increased. Thus, the concentration of alkali metal or alkaline earth metal in the semiconductor layer that is obtained by secondary ion mass spectrometry is set to lower than or equal to $1\times10^{18}$ atoms/cm$^3$, preferably lower than or equal to $2\times10^{16}$ atoms/cm$^3$.

When nitrogen is contained in the metal oxide contained in the semiconductor layer, electrons serving as carriers are generated and the carrier density increases, so that the semiconductor layer easily becomes n-type. As a result, a transistor using a metal oxide that contains nitrogen easily have normally-on characteristics. Accordingly, the nitrogen concentration in the semiconductor layer that is obtained by secondary ion mass spectrometry is preferably set to lower than or equal to $5\times10^{18}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier in some cases. Thus, a transistor including an oxide semiconductor containing hydrogen tends to have normally-on characteristics. Accordingly, hydrogen in the channel formation region of the oxide semiconductor is preferably reduced as much as possible. Specifically, the hydrogen concentration in the channel formation region of the oxide semiconductor that is obtained by secondary ion mass spectrometry is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, even further preferably lower than $1\times10^{18}$ atoms/cm$^3$.

When an oxide semiconductor with sufficiently reduced impurities is used for a channel formation region in a transistor, stable electrical characteristics and reliability can be given.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

In addition, a CAC-OS (cloud-aligned composite oxide semiconductor) may be used for a semiconductor layer of a transistor disclosed in one embodiment of the present invention.

Note that the above-mentioned non-single-crystal oxide semiconductor can be suitably used for a semiconductor layer of a transistor disclosed in one embodiment of the present invention. In addition, as the non-single-crystal oxide semiconductor, the nc-OS or the CAAC-OS can be suitably used.

Note that in one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more kinds of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a stacked-layer structure including two or more kinds of regions selected from the above regions in some cases.

<Composition of CAC-OS>

The composition of a CAC-OS that can be used in a transistor disclosed in one embodiment of the present invention will be described below.

The CAC-OS is, for example, a composition of a material in which elements that contained in a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in the first region is larger than the atomic ratio of In to the element M in a second region, the first region is regarded as having a higher In concentration than the second region.

Note that IGZO is a common name and sometimes refers to one compound formed of In, Ga, Zn, and O. A typical example is a crystalline compound represented by $InGaO_3(ZnO)_{m1}$ (m1 is a natural number; however, m1 is not 0) or $In_{(1+x0)}Ga_{(1-x0)}O_3(ZnO)_{m0}$ ($-1\leq x0\leq1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included. Note that a clear boundary between the region where $GaO_{X3}$ is a main component and the region where $In_{X2}Zn_{Y2}O_{Z2}$ or $InO_{X1}$ is a main component cannot be observed in some cases.

Note that when one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from the X-ray diffraction measurement that no alignment in the a-b plane direction and the c-axis direction is observed in the measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Thus, the electron diffraction pattern indicates that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions containing the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of a metal oxide is exhibited. Accordingly, when the regions where $In_{X2}Zn_{Y2}O_{Z2}$ or $InO_{X1}$ is a main component are distributed in a metal oxide like a cloud, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in a metal oxide, leakage current can be inhibited and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used in a variety of semiconductor devices typified by a display.

Since a transistor including the CAC-OS in a semiconductor layer has high field-effect mobility and high drive capability, the use of the transistor in a driver circuit, a typical example of which is a scan line driver circuit that generates a gate signal, can provide a display device with a narrow bezel width (also referred to a narrow bezel). Furthermore, with the use of the transistor in a signal line driver circuit that is included in a display device (particularly in a demultiplexer connected to an output terminal of a shift register included in a signal line driver circuit), a display device to which a small number of wirings are connected can be provided.

Furthermore, unlike a transistor including low-temperature polysilicon, the transistor including a CAC-OS in the semiconductor layer does not need a laser crystallization step. Thus, the manufacturing cost of a display device can be reduced even when the display device is formed using a large area substrate. In addition, the transistor including a CAC-OS in the semiconductor layer is preferably used for a driver circuit and a display portion in a large display device having high resolution such as ultra-high definition ("4K definition", "4K2K", and "4K") or super high definition ("8K definition", "8K4K", and "8K"), in which case writing can be performed in a short time and display defects can be reduced.

Alternatively, silicon may be used for a semiconductor in which a channel of a transistor is formed. Although amorphous silicon may be used as silicon, silicon having crystallinity is particularly preferably used. For example, microcrystalline silicon, polycrystalline silicon, or single crystal silicon is preferably used. In particular, polycrystalline silicon can be formed at a temperature lower than that for single crystal silicon and has higher field-effect mobility and higher reliability than amorphous silicon.

[Conductive Layer]

As materials that can be used for conductive layers such as a variety of wirings and electrodes included in a display device in addition to a gate, a source, and a drain of a transistor, metals such as aluminum, titanium, chromium, nickel, copper, yttrium, zirconium, molybdenum, silver, tantalum, and tungsten, or an alloy containing any of these metals as its main component can be given. A single layer or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesiumaluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, and a three-layer structure in which an aluminum film or a copper film is stacked over a molybdenum film or a molybdenum nitride film and a molybdenum film or a molybdenum nitride film is formed thereover can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include a resin such as an acrylic resin or an epoxy resin, a resin having a siloxane bond, such as silicone, and an inorganic insulating material such as silicon oxide, silicon oxynitride, silicon nitride oxide, silicon nitride, or aluminum oxide.

Note that in this specification, an oxynitride refers to a material that contains more oxygen than nitrogen in its composition, and a nitride oxide refers to a material that contains more nitrogen than oxygen in its composition. For example, when silicon oxynitride is described, it refers to a material that contains more oxygen than nitrogen in its composition; when silicon nitride oxide is described, it refers to a material that contains more nitrogen than oxygen in its composition.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

[Structure Example of Display Module]

A structure example of a display module including the display device of one embodiment of the present invention will be described below.

Figure 12A:
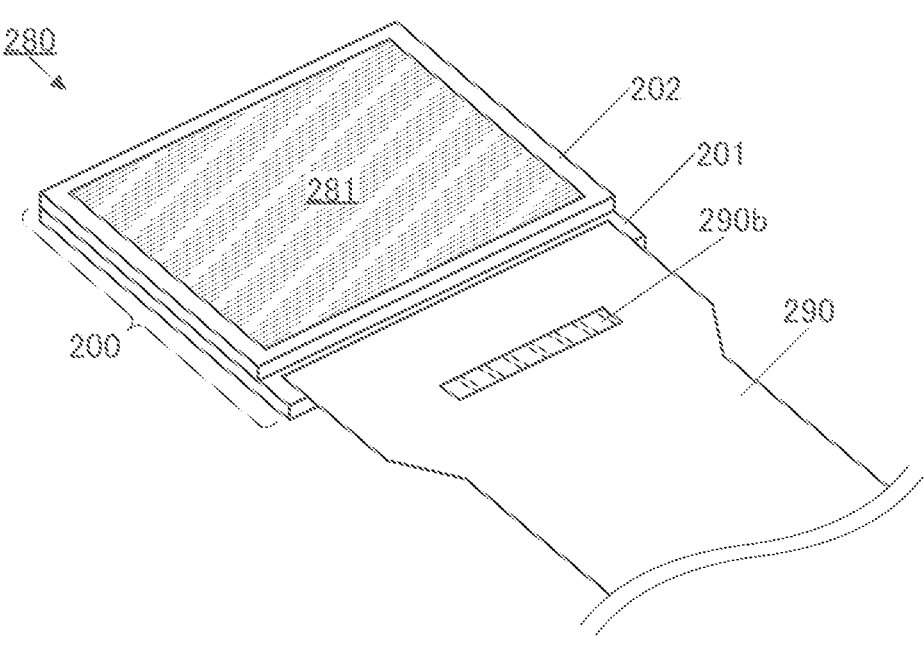
FIG. 12A and FIG. 12B are diagrams illustrating a structure example of a display module.

FIG. 12A is a schematic perspective view of a display module 280. The display module 280 includes a display device 200 and an FPC 290. Any of the display devices (the display device 200A to the display device 200D) described in Structure Example 2 can be used as the display device 200.

The display module 280 includes the substrate 201 and the substrate 202. A display portion 281 is also included on the substrate 202 side. The display portion 281 is a region of the display module 280 where an image is displayed and is a region where light emitted from pixels provided in a pixel portion 284 described later can be seen. The display module 280 may include a source driver IC 290b.

Figure 12B:
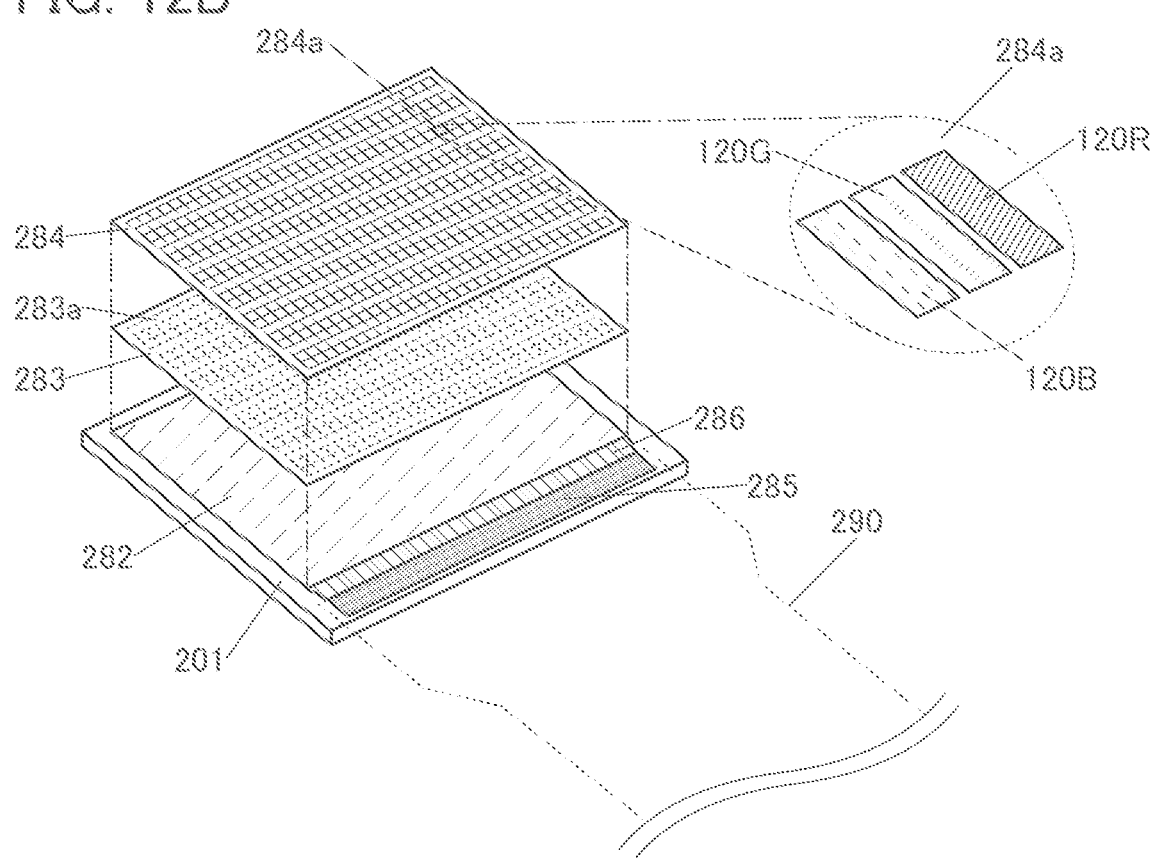

FIG. 12B illustrates a perspective view schematically illustrating a structure on the substrate 201 side. The substrate 201 has a structure in which a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 201. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 12B. The pixel 284a includes the light-emitting element 120R, the light-emitting element 120G, and the light-emitting element 120B.

The pixel circuit portion 283 includes a plurality of pixel circuits 283a arranged periodically. A plurality of pixels 284a and a plurality of pixel circuits 283a may be arranged in a stripe pattern as illustrated in FIG. 12B. Note that the plurality of pixels 284a and the plurality of pixel circuits 283a may be arranged in a delta pattern without limitation to the stripe pattern.

One pixel circuit 283a is a circuit that controls light emission of three light-emitting elements included in one pixel 284a. One pixel circuit 283a may be provided with three circuits for controlling light emission of respective light-emitting elements. For example, the pixel circuit 283a for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display device is achieved.

The circuit portion 282 includes a circuit for driving the pixel circuits 283a in the pixel circuit portion 283. For example, a gate line driver circuit and a source line driver circuit are preferably included. In addition, an arithmetic circuit, a memory circuit, a power supply circuit, or the like may be included.

The FPC 290 functions as a wiring for supplying a video signal, a power supply potential, or the like to the circuit portion 282 from the outside. In addition, an IC may be mounted on the FPC 290.

The display module 280 can have a structure in which the pixel circuit portion 283, the circuit portion 282, or the like are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without limitation to the above, the display module 280 can also be suitably used for an electronic device including a relatively small display portion. For example, the display module 280 can be suitably used for a display portion of a wearable electronic device such as a wrist watch.

At least part of this embodiment can be appropriately implemented in combination with the other embodiments described in this specification.

Embodiment 2

In this embodiment, a display device of one embodiment of the present invention will be described with reference to FIG. 13.

Figure 13A:
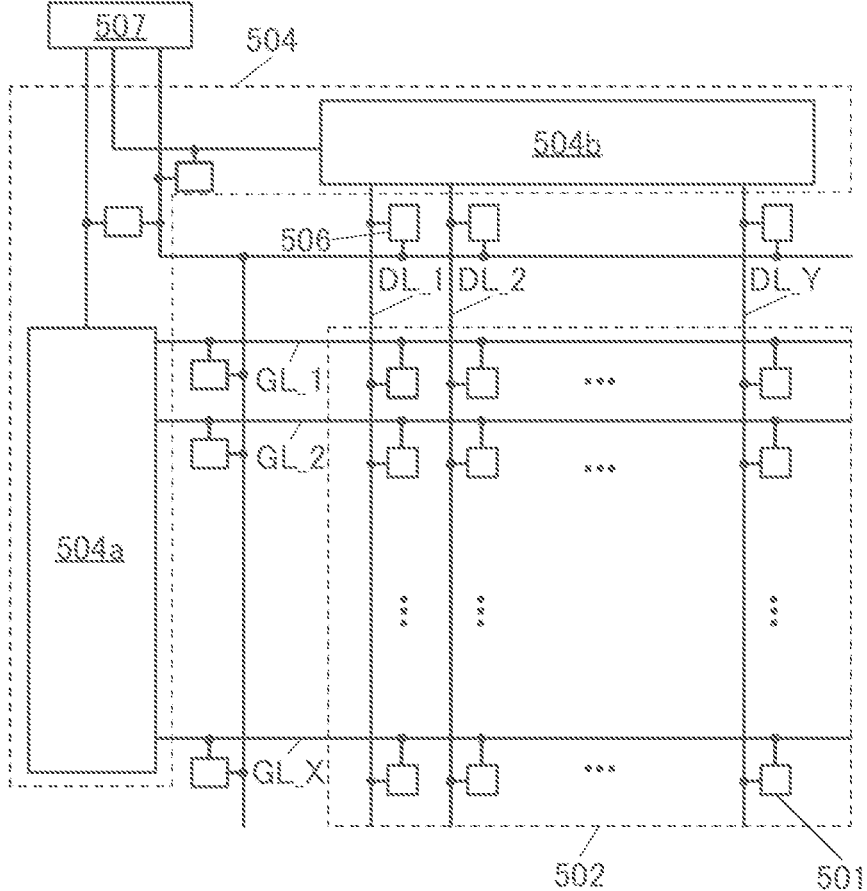
FIG. 13A and FIG. 13B are circuit diagrams illustrating examples of a display device.

A display device illustrated in FIG. 13A includes a pixel portion 502, a driver circuit portion 504, protection circuits 506, and a terminal portion 507. Note that the display device of one embodiment of the present invention may have a structure in which the protection circuits 506 are not provided.

The pixel portion 502 includes a plurality of pixel circuits 501 arranged in X rows and Y columns (X and Y each independently represent a natural number of 2 or more). Each pixel circuit 501 includes a circuit each of which drives a display element.

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 13A is connected to a variety of wirings such as the gate lines GL that are wirings between the gate driver 504a and the pixel circuits 501 and the data lines DL that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

In particular, the gate driver 504a and the source driver 504b are preferably placed below the pixel portion 502.

Figure 13B:
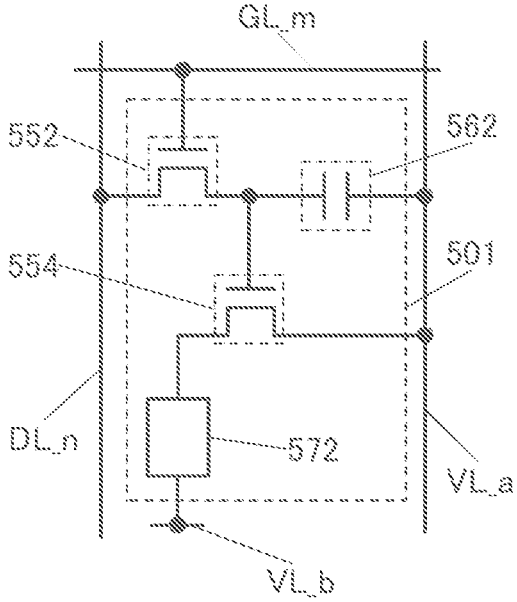

The plurality of pixel circuits 501 illustrated in FIG. 13A can have a configuration illustrated in FIG. 13B, for example.

The pixel circuit 501 illustrated in FIG. 13B includes transistors 552 and 554, a capacitor 562, and a light-emitting element 572. A data line DL n, a gate line GL_m, a potential supply line VL_a, a power supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of this embodiment can be appropriately implemented in combination with the other embodiments described in this specification.

Embodiment 3

A pixel circuit including a memory for correcting gray levels displayed by pixels that can be used in a display device of one embodiment of the present invention and the display device including the pixel circuit will be described below.

[Circuit Configuration]

Figure 14A:
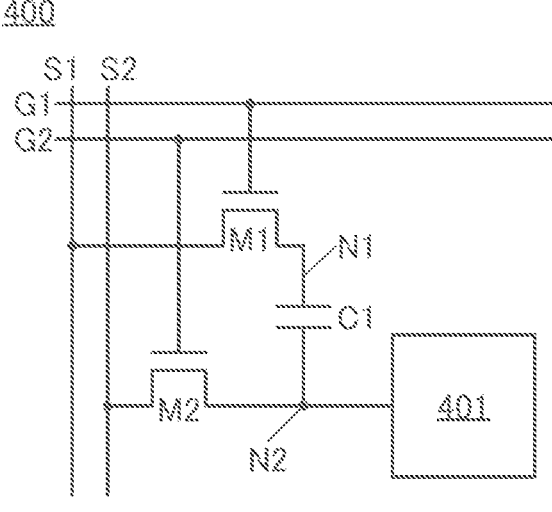
FIG. 14A and FIG. 14C are circuit diagrams illustrating examples of display devices.

FIG. 14A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that when the period in which the potential of each node is retained is short (specifically, the case where the frame frequency is higher than or equal to 30 Hz, for example), a transistor using a semiconductor such as silicon may be used.

[Driving Method Example]

Figure 14B:
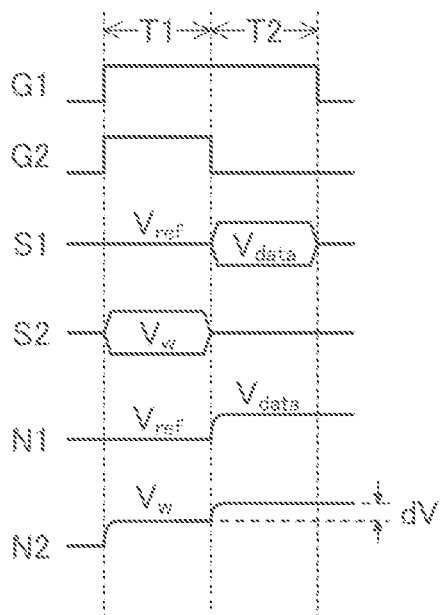
FIG. 14B is a timing chart showing an operation example of the display device.

Next, an example of a method for operating the pixel circuit 400 is described with reference to FIG. 14B. FIG. 14B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 14B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is applied to both the wiring G1 and the wiring G2. In addition, a potential $V_{ref}$ that is a fixed potential is supplied to the wiring S1, and the first data potential $V_w$ is supplied to the wiring S2.

The potential $V_{ref}$ is supplied from the wiring S1 to the node N1 through the transistor M1. The first data potential $V_w$ is supplied to the node N2 from the wiring S2 through the transistor M2. Accordingly, a potential difference $V_w$-$V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. The second data potential $V_{data}$ is supplied to the wiring S1. The wiring S2 may be supplied with a predetermined constant potential or brought into a floating state.

The second data potential $V_{data}$ is supplied to the node N1 from the wiring S1 through the transistor M1. At this time, capacitive coupling due to the capacitor C1 changes the potential of the node N2 in accordance with the second data potential $V_{data}$ by a potential dV. That is, a potential that is the sum of the first data potential V, and the potential dV is input to the circuit 401. Note that although the potential dV is shown as a positive value in FIG. 14B, the dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Example

Figure 14C:
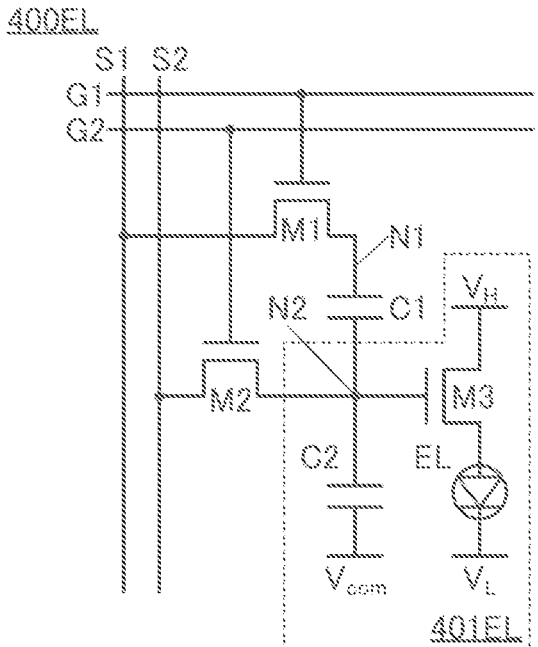

A pixel circuit 400EL illustrated in FIG. 14C includes a circuit 401EL. The circuit 401EL includes a light-emitting element EL, a transistor M3, and a capacitor C2.

In the transistor M3, a gate is connected to the node N2 and one electrode of the capacitor C2, one of a source and a drain is connected to a wiring supplying a potential VH, and the other is connected to one electrode of the light-emitting element EL. The other electrode of the capacitor C2 is connected to a wiring supplying a potential $V_{com}$. The other electrode of the light-emitting element EL is connected to a wiring supplying a potential VL.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential VH and the potential VL can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 or the light-emitting element EL can be corrected by supply of a correction signal to the wiring S1 or the wiring S2.

Note that the configuration is not limited to the circuit shown in FIG. 14C, and a configuration to which a transistor, a capacitor, or the like is further added may be employed.

At least part of this embodiment can be appropriately implemented in combination with the other embodiments described in this specification.

Embodiment 4

In this embodiment, structure examples of an electronic device for which the display device of one embodiment of the present invention is used will be described.

The display device and the display module of one embodiment of the present invention can be applied to a display portion of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display device and the display module of one embodiment of the present invention can have a high resolution, and thus can be suitably used for an electronic device having a relatively small display portion. Examples of the electronic device include a watch-type or bracelet-type information terminal device (wearable device); and a wearable device worn on a head, such as a device for VR such as a head mounted display and a glasses-type device for AR.

Figure 15A:
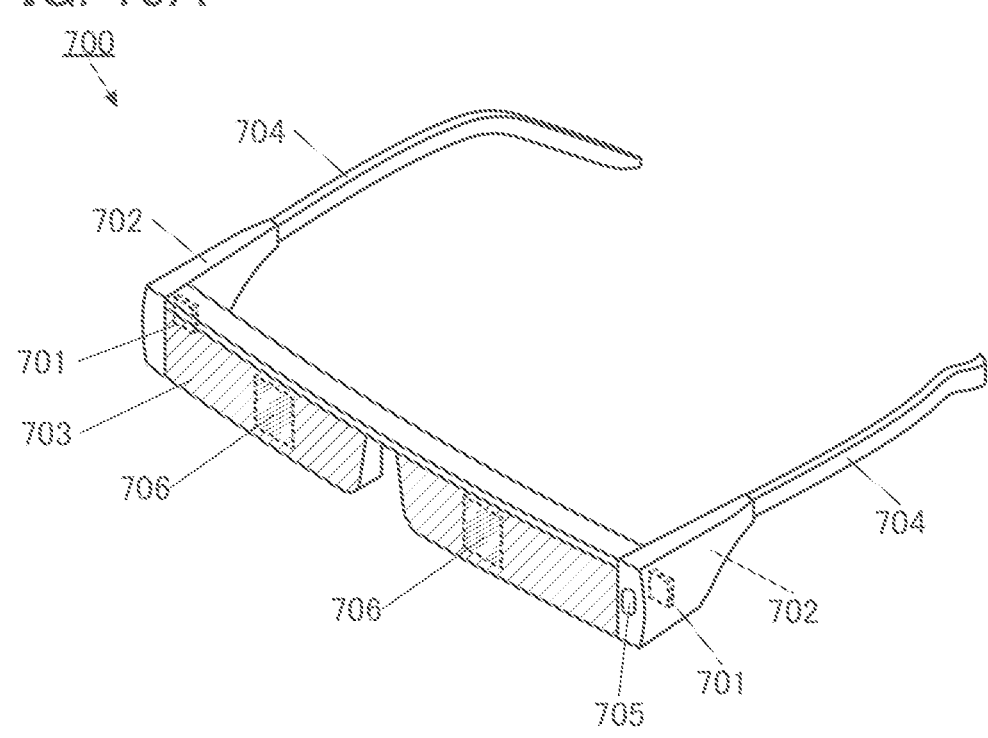
FIG. 15A and FIG. 15B are diagrams illustrating a structure example of an electronic device.

FIG. 15A is a perspective view of an electronic device 700 that is of a glasses type. The electronic device 700 includes a pair of display panels 701, a pair of housings 702, a pair of optical members 703, a pair of temples 704, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One housing 702 is provided with a camera 705 capable of taking an image of what lies in front thereof. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery and charging can be performed with or without a wire.

Figure 15B:
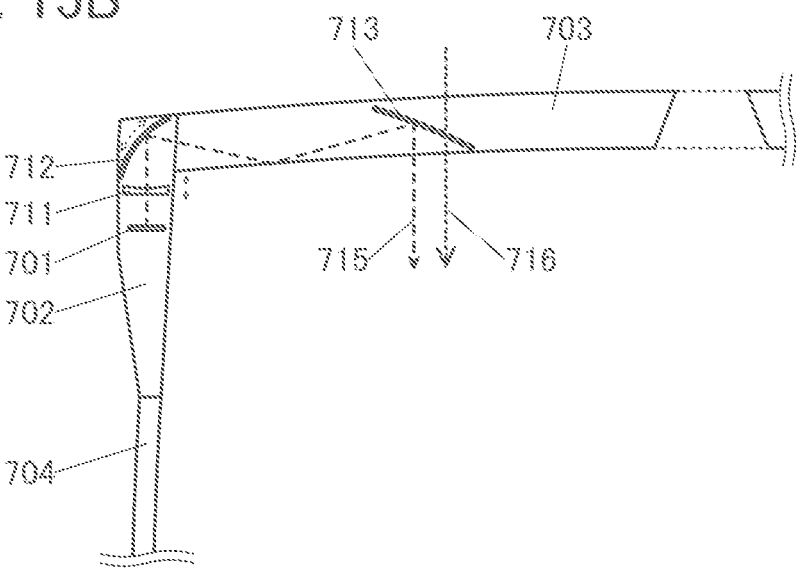

Next, a method for projecting an image on the display region 706 of the electronic device 700 is described with reference to FIG. 15B. The display panel 701, a lens 711, and a reflective plate 712 are provided in the housing 702. A reflective surface 713 functioning as a half mirror is provided in a portion corresponding to the display region 706 of the optical member 703.

Light 715 emitted from the display panel 701 passes through the lens 711 and is reflected by the reflective plate 712 to the optical member 703 side. In the optical member 703, the light 715 is fully reflected repeatedly by end surfaces of the optical member 703 and reaches the reflective surface 713, whereby an image is projected on the reflective surface 713. Accordingly, the user can see both the light 715 reflected by the reflective surface 713 and transmitted light 716 transmitted through the optical member 703 (including the reflective surface 713).

FIG. 15 illustrates an example in which the reflective plate 712 and the reflective surface 713 each have a curved surface. This can increase optical design flexibility and reduce the thickness of the optical member 703, compared to the case where they have flat surfaces. Note that the reflective plate 712 and the reflective surface 713 may be flat.

The reflective plate 712 can use a component having a mirror surface, and preferably has high reflectivity. As the reflective surface 713, a half mirror utilizing reflection of a metal film may be used, but the use of prism utilizing total reflection or the like can increase the transmittance of the transmitted light 716.

Here, the housing 702 preferably includes a mechanism for adjusting the distance or angle between the lens 711 and the display panel 701. This enables focus adjustment and zooming in/out of image. One or both of the lens 711 and the display panel 701 are preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the most appropriate position in accordance with the position of the user's eye.

The display device or the display module of one embodiment of the present invention can be used for the display panel 701. Thus, the electronic device 700 can perform display with extremely high resolution.

Figure 16A:
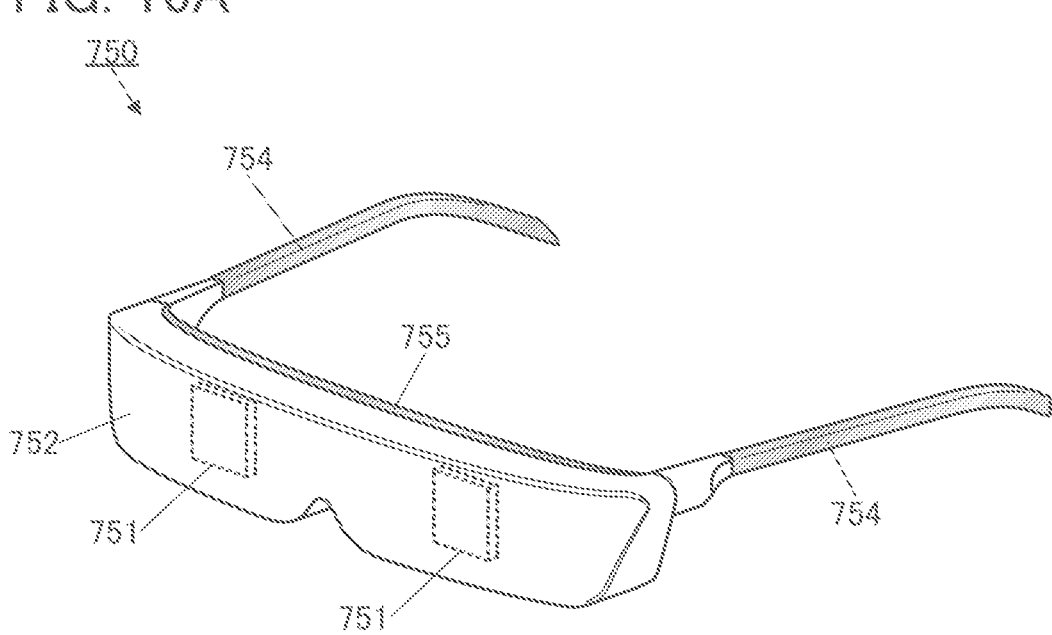
FIG. 16A and FIG. 16B are diagrams illustrating a structure example of an electronic device.
Figure 16B:
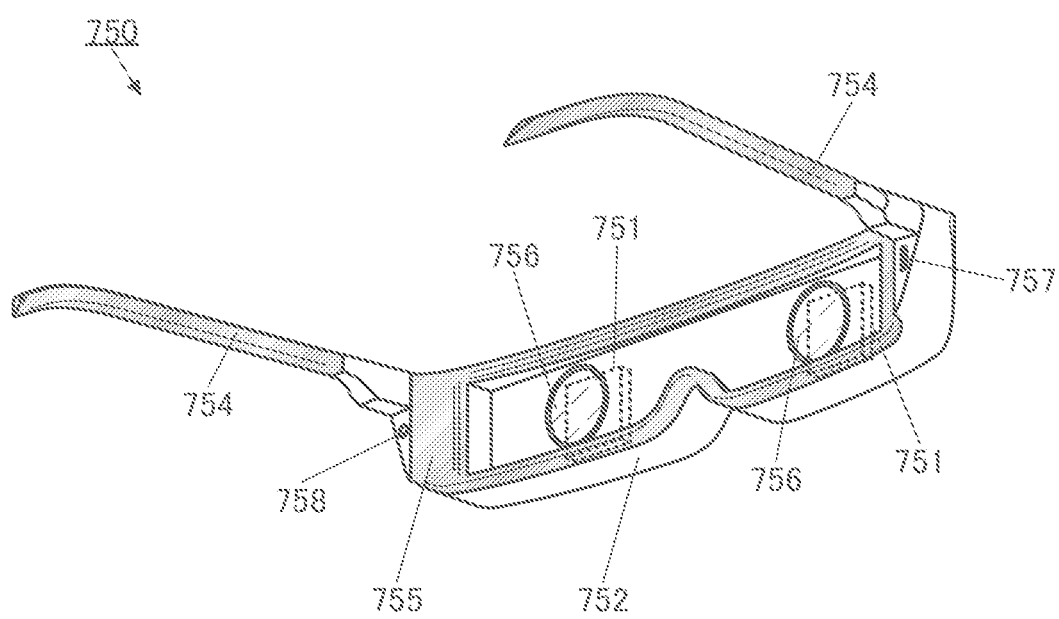

FIG. 16A and FIG. 16B illustrate perspective views of an electronic device 750 that is of a goggle-type. FIG. 16A is a perspective view illustrating the front surface, the top surface, and the left side surface of the electronic device 750, and FIG. 16B is a perspective view illustrating the back surface, the bottom surface, and the right side surface of the electronic device 750.

The electronic device 750 includes a pair of display panels 751, a housing 752, a pair of temples 754, a cushion 755, a pair of lenses 756, and the like. The pair of display panels 751 is positioned to be seen through the lenses 756 inside the housing 752.

The electronic device 750 is an electronic device for VR. A user wearing the electronic device 750 can see an image displayed on the display panel 751 through the lens 756. Furthermore, when the pair of display panels 751 displays different images, three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected. Note that when audio data can be output by wireless communication or sound is output from an external video output device, the audio output terminal is not necessarily provided.

In addition, the housing 752 preferably includes a mechanism by which the left and right positions of the lens 756 and the display panel 751 can be adjusted to the optimal positions in accordance with the position of the user's eye. In addition, the housing 752 preferably includes a mechanism for adjusting focus by changing the distance between the lens 756 and the display panel 751.

The display device or the display module of one embodiment of the present invention can be used for the display panel 751. Thus, the electronic device 750 can perform display with extremely high resolution. This enables a user to feel high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used for the cushion 755 so that the cushion 755 is in close contact with the face of the user wearing the electronic device 750. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

At least part of this embodiment can be appropriately implemented in combination with the other embodiments described in this specification.

REFERENCE NUMERALS

C1: capacitor, C2: capacitor, DL_Y: data line, DL_1: data line, G1: wiring, G2: wiring, GL_X: gate line, GL_1: gate line, M1: transistor, M2: transistor, M3: transistor, N1: node, N2: node, RES1: resist, RES2: resist, RES3: resist, S1: wiring, S2: wiring, T1: period, T2: period, 100: display device, 101: substrate, 111: conductive layer, 111a: conductive layer, 111b: conductive layer, 114: conductive layer, 114B: conductive layer, 114G: conductive layer, 114R: conductive layer, 115: EL layer, 115f: EL layer, 115a: EL layer, 115b: EL layer, 115B: EL layer, 115Bf: EL layer, 115G: EL layer, 115Gf: EL layer, 115R: EL layer, 115Rf: EL layer, 116: conductive layer, 116f: conductive layer, 117: insulator, 120: light-emitting element, 120B: light-emitting element, 120G: light-emitting element, 120R: light-emitting element, 121: insulating layer, 122: insulating layer, 124: insulating layer, 124*a*: layer, 124*b*: layer, 124*c*: layer, 125: insulating layer, 131: plug, 162: insulating layer, 163: insulating layer, 164: adhesive layer, 165B: coloring layer, 165G: coloring layer, 165R: coloring layer, 200: display device, 200A: display device, 200B: display device, 200C: display device, 200D: display device, 201: substrate, 202: substrate, 210: transistor, 211: conductive layer, 212: low-resistance region, 213: insulating layer, 214: insulating layer, 215: element isolation layer, 220: transistor, 221: semiconductor layer, 223: insulating layer, 224: conductive layer, 225: conductive layer, 226: insulating layer, 227: conductive layer, 228: insulating layer, 229: insulating layer, 230: transistor, 231: insulating layer, 232: insulating layer, 240: capacitor, 241: conductive layer, 242: conductive layer, 243: insulating layer, 251: conductive layer, 252: conductive layer, 253: conductive layer, 261: insulating layer, 261*a*: insulating layer, 261*b*: insulating layer, 262: insulating layer, 263: insulating layer, 264: insulating layer, 265: insulating layer, 271: plug, 271*a*: conductive layer, 271*b*: conductive layer, 272: plug, 273: plug, 274: plug, 280: display module, 281: display portion, 282: circuit portion, 283: pixel circuit portion, 283*a*: pixel circuit, 284: pixel portion, 284*a*: pixel, 285: terminal portion, 286: wiring portion, 290: FPC, 290*b*: source driver IC, 400: pixel circuit, 400EL: pixel circuit, 401: circuit, 401EL: circuit, 501: pixel circuit, 502: pixel portion, 504: driver circuit portion, 504*a*: gate driver, 504*b*: source driver, 506: protection circuit, 507: terminal portion, 552: transistor, 554: transistor, 562: capacitor, 572: light-emitting element, 700: electronic device, 701: display panel, 702: housing, 703: optical member, 704: temple, 705: camera, 706: display region, 711: lens, 712: reflective plate, 713: reflective surface, 715: light, 716: transmitted light, 750: electronic device, 751: display panel, 752: housing, 754: temple, 755: cushion, 756: lens, 757: input terminal, 758: output terminal, 4411: light-emitting layer, 4412: light-emitting layer, 4413: light-emitting layer, 4420: layer, 4420-1: layer, 4420-2: layer, 4430: layer, 4430-1: layer, and 4430-2: layer.

The invention claimed is:

1. A display device comprising:
a light-emitting element; and
an insulating layer placed to cover the light-emitting element,
wherein the light-emitting element comprises:
a first conductive layer;
an EL layer over the first conductive layer; and
a second conductive layer over the EL layer,
wherein the insulating layer comprises:
a first layer;
a second layer over the first layer; and
a third layer over the second layer,
wherein the first layer is configured to capture or fix at least one of water and oxygen,
wherein the second layer is configured to inhibit diffusion of at least one of water and oxygen, and
wherein the third layer has a higher concentration of carbon than at least one of the first layer and the second layer.

2. A display device comprising:
a transistor over a substrate;
a first insulating layer over the transistor;
a plug placed to be embedded in the first insulating layer;

a light-emitting element over the first insulating layer; and
a second insulating layer placed to cover the light-emitting element,
wherein the light-emitting element comprises:
a first conductive layer;
an EL layer over the first conductive layer; and
a second conductive layer over the EL layer,
wherein the plug electrically connects one of a source and a drain of the transistor and the first conductive layer,
wherein the second insulating layer comprises:
a first layer;
a second layer over the first layer; and
a third layer over the second layer,
wherein the first layer is configured to capture or fix at least one of water and oxygen,
wherein the second layer is configured to inhibit diffusion of at least one of water and oxygen, and
wherein the third layer has a higher concentration of carbon than at least one of the first layer and the second layer.

3. The display device according to claim 2, further comprising:
a third insulating layer between the first insulating layer and the light-emitting element,
wherein the third insulating layer is configured to inhibit diffusion of at least one of water and oxygen.

4. The display device according to claim 3,
wherein the third insulating layer comprises nitrogen and silicon.

5. The display device according to claim 3,
wherein the third insulating layer is in contact with the second insulating layer in a region not overlapping with the light-emitting element.

6. The display device according to claim 2,
wherein the substrate is a silicon substrate, and
wherein the transistor comprises silicon in a channel formation region.

7. The display device according to claim 2,
wherein an oxide semiconductor film is provided over the substrate, and
wherein the transistor comprises the oxide semiconductor film in a channel formation region.

8. The display device according to claim 1,
wherein the first layer is in contact with a side surface of the EL layer.

9. The display device according to claim 1,
wherein the first layer is deposited by a sputtering method.

10. The display device according to claim 1,
wherein the first layer comprises oxygen and aluminum.

11. The display device according to claim 1,
wherein the first layer comprises oxygen and hafnium.

12. The display device according to claim 1,
wherein the second layer is deposited by a sputtering method.

13. The display device according to claim 1,
wherein the second layer comprises nitrogen and silicon.

14. The display device according to claim 1,
wherein the third layer is deposited by an ALD method.

15. The display device according to claim 1,
wherein the third layer has a higher concentration of hydrogen than at least one of the first layer and the second layer.

16. The display device according to claim 1,
wherein the third layer has a lower density than at least one of the first layer and the second layer.

17. The display device according to claim 1,
wherein the third layer comprises oxygen and aluminum.

18. The display device according to claim 1,
wherein the side surface of the EL layer is positioned
    inward from a side surface of the first conductive layer.

19. The display device according to claim 1,
wherein the EL layer covers the side surface of the first
    conductive layer.

20. The display device according to claim 1,
wherein an insulator is placed between the EL layer and
    the first conductive layer,
wherein the insulator has an opening over the first con-
    ductive layer, and
wherein the EL layer is in contact with the first conductive
    layer in the opening.

\*   \*   \*   \*   \*